United States Patent [19]
Sakao

[11] Patent Number: 6,031,262
[45] Date of Patent: Feb. 29, 2000

[54] SEMICONDUCTOR MEMORY DEVICE HAVING CAPACITOR-OVER-BITLINE CELL WITH MULTIPLE CYLINDRICAL STORAGE ELECTRODE OFFSET FROM NODE CONTACT AND PROCESS OF FABRICATION THEREOF

[75] Inventor: Masato Sakao, Tokyo, Japan

[73] Assignee: NEC Corporation, Tokyo, Japan

[21] Appl. No.: 08/970,288

[22] Filed: Nov. 14, 1997

[30] Foreign Application Priority Data

Nov. 14, 1996 [JP] Japan .................................. 8-302677

[51] Int. Cl.[7] .......................... H01L 27/108; H01L 29/76; H01L 29/94; H01L 31/119
[52] U.S. Cl. ............................ 257/306; 257/309; 257/296
[58] Field of Search .................................. 257/296–310; 436/243–253, 396–399

[56] References Cited

U.S. PATENT DOCUMENTS 5,438,010  8/1995  Saeki ........................................ 438/396

FOREIGN PATENT DOCUMENTS

| | | |
|---|---|---|
| 61-55258 | 11/1986 | Japan . |
| 1-179449 | 7/1989 | Japan . |
| 3-72675 | 3/1991 | Japan . |
| 3-124059 | 5/1991 | Japan . |
| 4-10566 | 1/1992 | Japan . |
| 5-218333 | 8/1993 | Japan . |
| 6-151747 | 5/1994 | Japan . |
| 7-29994 | 1/1995 | Japan . |
| 8-78641 | 3/1996 | Japan . |

*Primary Examiner*—Minh Loan Tran
*Assistant Examiner*—Cuong Q Nguyen
*Attorney, Agent, or Firm*—Hutchins, Wheeler & Dittmar

[57] ABSTRACT

A storage capacitor with a double cylindrical storage electrode is incorporated in a semiconductor dynamic random access memory cell, the double cylindrical storage electrode is electrically connected through a node contact hole to a source region of a switching transistor, the double cylindrical storage electrodes are offset from the associated node contact holes so as not to have the minimum dimension in the planar configuration thereof, and cylinders are multiplied on a base portion of the storage electrode.

20 Claims, 27 Drawing Sheets

Fig·11

SEMICONDUCTOR MEMORY DEVICE HAVING CAPACITOR-OVER-BITLINE CELL WITH MULTIPLE CYLINDRICAL STORAGE ELECTRODE OFFSET FROM NODE CONTACT AND PROCESS OF FABRICATION THEREOF

FIELD OF THE INVENTION

This invention relates to a semiconductor memory device and, more particularly, to a semiconductor dynamic random access memory device having a capacitor over bit-line cell with a multiple cylindrical storage electrode offset from a node contact and a process for fabricating thereof.

DESCRIPTION OF THE RELATED ART

Semiconductor manufacturers have increased the storage density of the dynamic random access memory device at annual rate of 4/3, and the development efforts are being made on 256 mega-bit dynamic random access memory device and a giga-bit dynamic random access memory device. The semiconductor manufacturer has increased the storage density through miniaturization of circuit components. Not only the switching transistor but also the storage capacitor are miniaturized, and, accordingly, the amount of electric charge stored in the storage capacitor is decreased. As a result, the signal-to-noise ratio is lowered, and the soft error due to alpha particles becomes serious.

In order to increase the capacitance of the storage capacitor without increase of the occupation area, a stacked capacitor was proposed. A typical example of the stacked capacitor is disclosed in Japanese Patent Publication of Examined Application No. 61-55258, and a memory cell with the stacked capacitor is called as stacks d capacitor cell. The stacked capacitor cell is improved into a capacitor over bit-line cell, and FIGS. 1 and 2 illustrate the first prior art capacitor over bit-line cell disclosed in Japanese Patent Publication of Unexamined Application No. 1-179449. Although the prior art capacitor over bit-line cell has a multi-layered structure, all the layers are drawn by using real lines, because the real lines make the layout clear rather than broken lines. A thick field oxide layer I is selectively grown on a semiconductor substrate 2, and defines a plurality of active areas 1a. The active areas 1a are rimmed with hatching lines so as to be clearly discriminated. Bit lines 3 extend in parallel to one another, and have a width Bd. Word lines 4 extend in perpendicular to the bit lines 3. The active area 1a has a central portion 1b and contact portions 1c/1d at both ends of the central portion 1b. The central portion 1b is directed at 45 degrees with respect to the bit lines 3 and the word lines 4, and the contact portions 1c/1d are bent from the central portion 1b so as to be in parallel to the bit lines 3. A pair of word lines 4 is shared between a line of the active areas 1a, and another word lines 4 adjacent to the pair of word lines 4 is shared between another line of the active areas 1a. The central portions 1b of the line are perpendicular to the central portions 1b of the adjacent line. Thus, the lines of the active areas 1a alternately change the direction of the central portions 1b, and each central portion 1b is surrounded by four central portions 1b different in direction therefrom. In this way, the active areas 1a are arranged over the major surface of the semiconductor substrate at high density.

The active area 1a provides source regions 1e, a drain region 1f and channel regions 1g for two switching transistors (see FIG. 2). The channel regions 1g are covered with thin gate oxide layers 5, and the word lines 4 pass over the thin gate oxide layers 5 so as to serve as gate electrodes. The word lines 4 are covered with a first inter-level insulating layer 6, and the bit lines 3 extend over the first inter-level insulating layer 6, and are held in contact with the drain regions If through bit contact holes 6a. The bit contact holes 6a are marked with "/" in FIG. 1.

The bit lines 3 are covered with a second inter-level insulating layer 7, and node contact holes 7a are formed in the first inter-level insulating layer 6 and the second inter-level insulating layer 7. The node contact holes 7a are also marked with "X" in FIG. 1. Storage electrodes 8 are patterned on the second inter-level insulating layer 7, and are held in contact with the contact portions 1c/1d serving as the source regions 1e through the node contact holes 7a. The storage electrodes 8 are covered with dielectric films 9, and counter electrode 10 are opposed through the dielectric films to the storage electrodes 8.

As described hereinbefore, the central portions 1b obliquely extend with respect to the bit lines 3, and the node contacts 7a are formed between the bit lines 3. The node contacts 7a allow the storage electrodes 8 to extend over the bit lines 3. Any contact hole is not provided between the storage electrodes 8, and this layout allows storage electrodes 8 to extend as wide as possible. For this reason, S1 arid S2 are the minimum dimension, and the node contact 7a is around the center of the storage electrode 8.

Another capacitor over bit-line cell is disclosed in Japanese Patent Publication of Unexamined Application No. 3-72675. FIGS. 3 and 4 illustrate the second prior art capacitor over-bit line cell disclosed in the Japanese Patent Publication of Unexamined Application. A thick field oxide layer 21 is selectively grown on a semiconductor substrate 22, and defines a plurality of active areas 21a. Broken lines indicate the active areas 1a in FIG. 3. Bit lines 23 extend in parallel to one another, and word lines 24 extend in perpendicular to the bit lines 23. The active areas 1a are oblique with respect to the bit lines 23 and the word lines 24. However, all the active areas 1a are directed to the same direction. Each active area 1a crosses one of the word line 24 and two bit lines 23, and two memory cells are formed in the active area as similar to the first prior art capacitor over bit-line cells.

The active area 1a provides source regions 21e, a drain region 21f and channel regions 21g for two switching transistors (see FIG. 4). The channel regions 21g are covered with thin gate oxide layers 25, and the word lines 24 pass over the thin gate oxide layers 25 so as to serve as gate electrodes. The word lines 24 are covered with a first inter-level insulating layer 26, and the bit lines 23 extend over the first inter-level insulating layer 26, and are held in contact with the drain regions 21f through bit contact holes 26a. The bit contact holes 26a are marked with "/" in FIG. 3.

The bit lines 23 are covered with a second inter-level insulating layer 27, and node contact holes 27a are formed in the first inter-level insulating layer 26 and the second inter-level insulating layer 27. The node contact holes 27a are also marked with "X" in FIG. 3. Storage electrodes 28 are patterned on the second inter-level insulating layer 27, and are held in contact with the source regions 21e through the node contact holes 27a. The storage electrodes 28 are shaped into a pentagon, and the node contacts 27a are offset from the centers of the storage electrodes 28. The storage electrodes 28 are covered with dielectric films 29, and counter electrode 30 are opposed through the dielectric films 29 to the storage electrodes 28.

Although the second prior art capacitor over bit-line cell is different in layout from the first prior art capacitor over bit-line cell, the storage electrodes 28 are patterned as wide as possible, and S3 is the minimum dimension. However, the upper surface of the stacked capacitor provides most of the effective surface for accumulating electric charge, and the prior art capacitor over bit-line cells reach the limit.

In order to drastically increase the capacitance of the stacked capacitor, a fin-shaped storage electrode and a cylindrical storage electrode are proposed. A typical example of the multiple cylindrical storage electrode is disclosed in Japanese Patent Publication of Unexamined Application No. 5-218333, and FIGS. 5A to 5C illustrate the prior art process for fabricating the third prior art capacitor over bit-line cell with a multiple cylindrical storage electrode disclosed in the Japanese Patent Publication of Unexamined Application.

Cell transistors 41 is fabricated on an active area defined by a thick field oxide layer 42 selectively grown on a semiconductor substrate 43, and are covered with a first inter-level insulating layer 44. A bit line 45 is patterned on the first inter-level insulating layer 44, and is held in contact with a common drain region of the cell transistors 41 through a bit contact hole 44a.

The bit line 45 is covered with a second inter-level insulating structure 46, and node contact holes 46a are formed in the second inter-level insulating structure 46. Doped polysilicon is deposited over the entire surface of the resultant structure. The doped polysilicon fills the node contact holes 46a, and swells into a polysilicon layer 47. The polysilicon layer 47 is held in contact with the source regions of the cell transistors 41 through the node contact holes 46a.

Silicon oxide is deposited over the entire surface of the resultant structure, and the silicon oxide layer is patterned into silicon oxide strips 48 over the node contact holes 46a by using lithography and a dry etching. The silicon oxide strips 48 define an inside area of multiple cylindrical portions, and are hereinbelow referred to as "core pattern".

Subsequently, side wall spacers 49 of silicon nitride are formed on the side surfaces of the silicon oxide strips 48. Using the core pattern/silicon oxide strips 48 and the side wall ;pacers 49 as an etching mask, the doped polysilicon layer 47 is partially etched away so as to form shallow grooves 47a as shown in figure 5A.

Subsequently, the silicon oxide strips 48 are etched away, and the doped polysilicon layer 47 is partially etched away again so as to form an inner cylinder 47b. The side wall spacers 49 are removed, and side wall spacers 50 of silicon nitride are formed on the inner side surfaces and the outer side surfaces of the inner cylinder 47b as shown in FIG. 5B.

Using the side wall spacers 50 as an etching mask, the doped polysilicon layer 47 is selectively etched away until the second inter-level insulating structure 46, and the doped polysilicon layer 47 is formed into double cylindrical storage electrodes 51. A spacer layer 46a of the second inter-level insulating structure 46 and the side wall spacers 50 are etched away so as to expose the reverse surfaces of the double cylindrical storage electrodes 51. Dielectric layers (not shown) are grown on the entire surfaces of the double cylindrical storage electrodes 51, and doped polysilicon is deposited over the dielectric layers for forming a cell plate electrode 52 as shown in FIG. 5C.

An inner cylindrical portion 51a and an outer cylindrical portion 51b project from a bottom portion 51c as shown in FIG. 6, and not only the surfaces of the inner/outer cylindrical portions 51a/5b but also the upper/reverse surfaces of the bottom portion 51c are available for the charge accumulation. Thus, the double cylindrical storage electrode 51 increases the capacitance of the storage capacitor. The double cylindrical storage electrode 51 has a center line CL1 aligned with the center line CL2 of the node contact hole 46a.

The third prior art capacitor over bit-line cell encounters a problem in that the double cylindrical storage electrode reaches the limit of miniaturization, and the double cylindrical storage electrode is difficult to use in the memory cell of the next generation.

SUMMARY OF THE INVENTION

It is therefore an important object of the present invention to provide the structure of a semiconductor dynamic random access memory cell, which is available for a semiconductor memory device of the next generation.

It is also an important object of the present invention to provide a process for fabricating the semiconductor dynamic random access memory cell.

The present inventor contemplated the problem, and noticed that the node contact holes were not uniformly arranged over the major surface of the semiconductor substrate as similar to the layouts shown in FIGS. 1 and 3. For example, the node contact hole 7a(A) was closer to the node contact hole 7a(B) rather than the node contact hole 7a(C) (see FIG. 1). Similarly, the node contact hole 27a(A) was closer to the node contact hole 27a(B) than the node contact hole 27a(C) (see FIG. 3), and was closer to the node contact hole 27a(C) than the node contact hole 27a(D).

When the node contact holes were irregularly arranged and aligned with the center line of the double cylindrical storage electrode, the storage electrode was hardly shaped into a regular polygonal configuration. Only a rectangular configuration was available as similar to the storage electrode 28.

As described hereinbefore with reference to FIGS. 5A to 5C, the cylindrical portions 51a/51b were located outside of the core pattern 48, and a certain area was required for the cylindrical portions 51a/51b. The certain area was at least twice as wide as the side wall spacers 49/50.

In this situation, if a cylindrical storage electrode was formed on the rectangular area as similar to the first capacitor over bit-line cell shown in FIG. 1. The width of the rectangular area set limit on the multiple configuration of the storage electrode, and only a single cylindrical electrode was formed in the rectangular area. Thus, the distance between the closest node contact holes set the limit on the number of cylindrical portions, and the cylindrical portion was hardly multiplied. The present inventor noticed that, when the center of each storage electrode was equal in distance to the centers of the adjacent storage electrodes, the long edge was shortened; however, the short edge was prolonged, and allowed the manufacturer to multiple the cylindrical portion.

To accomplish the object, the present invention proposes to make the distance between the centers of adjacent storage electrodes substantially constant. When the distance was equalized, more than one cylindrical portion was formed in the storage electrode of a 1 giga-bit semiconductor dynamic random access memory device, and the capacitance was increased at 40 to 60 percent.

In accordance with one aspect of the present invention, there is provided a semiconductor memory device comprising a plurality of switching transistors each including a source region formed in a semiconductor substrate, a drain region formed in the semiconductor substrate and spaced from the source region by a channel region and a gate insulating layer covering the channel region, a plurality of word lines selectively extending over the gate insulating layers of the plurality of switching transistors for serving as respective gate electrodes of the plurality of switching transistors, a plurality of bit lines extending over the plurality of switching transistors and selectively connected to the drain regions of the plurality of switching transistors, an inter-level insulating structure covering the plurality of bit lines and having a plurality of node contact holes open to the source regions of the plurality of switching transistors, respectively, and a plurality of storage capacitors provided over the inter-level insulating structure and each including an storage electrode electrically connected through one of the plurality of node contact holes to the source region of associated one of the plurality of switching transistors, a dielectric film structure covering the storage electrode and a counter electrode held in contact with the dielectric film structure, the storage electrodes of the plurality of storage capacitors have respective centers, and the center of each storage electrode is substantially equally spaced from the centers of adjacent storage electrodes.

In accordance with another aspect of the present invention, there is provided a process for fabricating semiconductor memory cells, comprising the steps of: a) preparing a semiconductor substrate having active areas defined in a major surface thereof; b) fabricating switching transistor on the active areas and having gate electrodes forming parts of a plurality of word lines; c) covering the switching transistors with a first inter-level insulating structure; d) forming bit lines extending on the first inter-level insulating structure and held in contact with first contact regions of the active areas through bit contact holes formed in the first inter-level insulating structure; e) covering the bit lines and the first inter-level insulating structure with a second inter-level insulating structure; f) forming node contact holes having lower ends open to second contact regions of the active areas and upper ends open to an upper surface of the second inter-level insulating structure; g) forming a first conductive layer on the second inter-level insulating structure electrically connected through the node contact holes to the second contact regions; h) forming a core pattern over the first conductive layer having mask members offset from the node contact holes, respectively, each of the mask members being substantially equally spaced from adjacent four mask members; i) covering the first conductive layer and the mask members with a second conductive layer; j) forming side wall spacers on portions of the second conductive layer held in contact with side surfaces of the mask members; k) covering the second conductive layer and the side wall spacers with a third conductive layer; l) uniformly etching the first, second and third conductive layers without an etching mask until the second inter-level insulating structure is exposed so as to form storage electrodes each having coaxial conductive members around one of the mask members; m) removing the mask members and the side wall spacers; n) covering the storage electrodes with dielectric material; and o) forming a plate electrode opposed to the storage electrodes.

In accordance with yet another aspect of the present invention, there is provided a process for fabricating semiconductor memory cells, comprising the steps of: a) preparing a semiconductor substrate having active areas defined in a major surface thereof; b) fabricating switching transistor on the active areas and having gate electrodes forming parts of a plurality of word lines; c) covering the switching transistors with a first inter-level insulating structure; d) forming bit lines extending on the first inter--level insulating structure and held in contact with first contact regions of the active areas through bit contact holes formed in the first inter-level insulating structure; e) covering the bit lines and the first inter-level insulating structure with a second inter-level insulating structure; f) forming node contact holes having lower ends open to second contact regions of the active areas and upper ends open to an upper surface of the second inter-level insulating structure; g) forming a first conductive layer on the second inter-level insulating structure electrically connected through the node contact holes to the second contact regions; h) forming a core pattern on the first conductive layer having mask members offset from the node contact holes, respectively, each of the mask members being substantially equally spaced from adjacent four mask members; i) patterning the first conductive layer into innermost conductive members by using the mask members; j) covering the mask members and the innermost conductive members with a second conductive members; k) uniformly etching the second conductive members without an etching mask until the mask members are exposed so that outer conductive cylinders are formed around the innermost conductive members, respectively, the innermost conductive members and the outer conductive cylinders forming storage electrodes; l) removing the mask members; m) covering the storage electrodes with dielectric material; and n) forming a plate electrode opposed to the storage electrodes.

In accordance with still another aspect of the present invention, there is provided a process for fabricating semiconductor memory cells, comprising the steps of: a) preparing a semiconductor substrate having active areas defined in a major surface thereof, b) fabricating switching transistor on the active areas and having gate electrodes forming parts of a plurality of word lines; c) covering the switching transistors with a first inter-level insulating structure; d) forming bit lines extending on the first inter-level insulating structure and held in contact with first contact regions of the active areas through bit contact holes formed in the first inter-level insulating structure; e) covering the bit lines and the first inter-level insulating structure with a second inter-level insulating structure; f) forming node contact holes having lower ends open to second contact regions of the active areas and upper ends open to an upper surface of the second inter-level insulating structure; g) forming a first conductive layer on the second inter-level insulating structure electrically connected through the node contact holes to the second contact regions; h) forming a core pattern on the first conductive layer having mask members offset from the node contact holes, respectively, each of the mask members being substantially equally spaced from adjacent four mask members; i) patterning the first conductive layer into a conductive structure having innermost conductive members by using the mask members, j) removing the mask members from the conductive structure; k) forming side wall spacers on side surfaces of the innermost conductive members; l) covering the conductive structure and the side wall spacers with a second conductive layer; m) uniformly etching the second conductive members without an etching mask until the innermost conductive members are exposed again so that outer conductive cylinders are formed on the side wall spacers, respectively, the innermost conductive members and the outer conductive cylinders forming storage electrodes; n) removing the side wall spacers; o) covering the storage electrodes with dielectric material; and p) forming a plate electrode opposed to the storage electrodes.

BRIEF DESCRIPTION OF THE DRAWINGS

The features and advantages of the semiconductor dynamic random access memory device and the process for fabrication thereof will be more clearly understood from the following description taken in conjunction with the accompanying drawings in which.

DESCRIPTION OF THE PREFERRED EMBODIMENTS

First Embodiment

Figure 7:
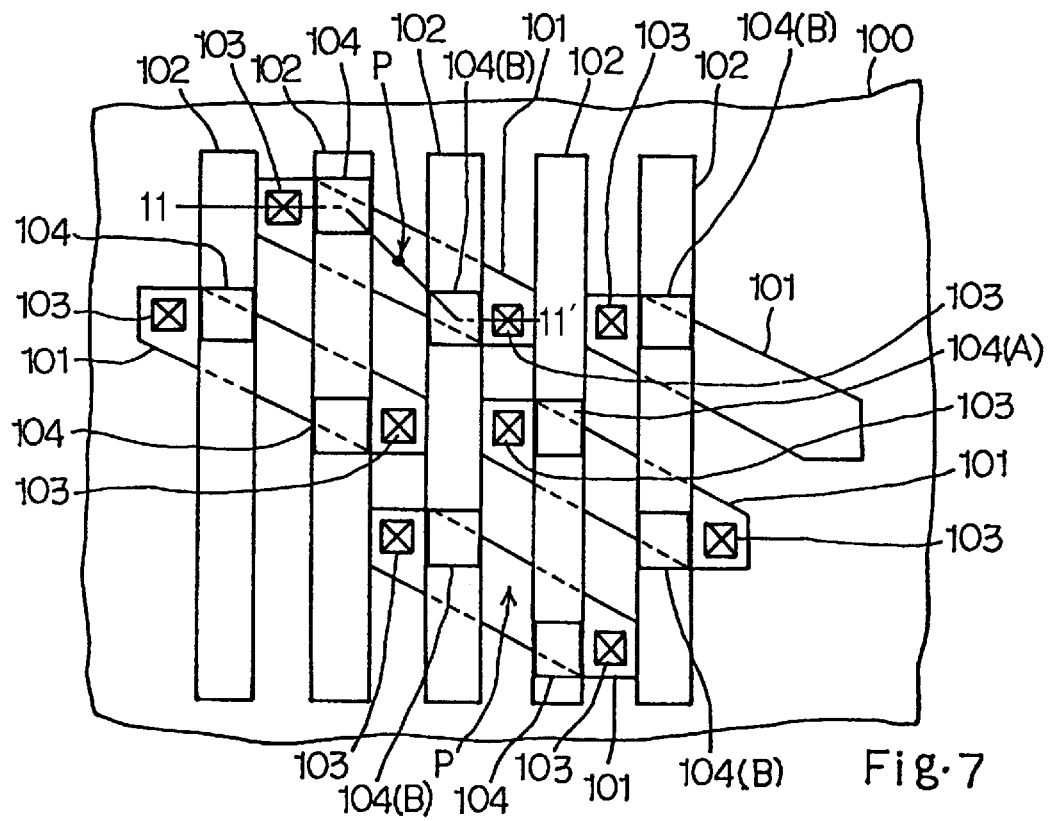
FIG. 7 is a plan view showing the relation between active areas, node contact holes, word lines amid mask strips incorporated in a semiconductor dynamic random access memory device according to the present invention.

Referring to FIG. 7 of the drawings, active areas 101 are defined on a major surface of a semiconductor substrate 100, and word lines 102 extend over the major surface. The word lines 102 extend in parallel to one another, and active areas 101 are oblique with respect to the word lines 102. Node contact holes 103 are open to both end portions of the active areas 101, and are marked with "X" in FIG. 7. Though not shown in FIG. 7, storage electrodes are held in contact with both end portions of the active areas 101 through the node contact holes 103, and a core pattern 104 defines inner areas inside of multiple cylindrical portions on the storage electrodes.

Figure 8:
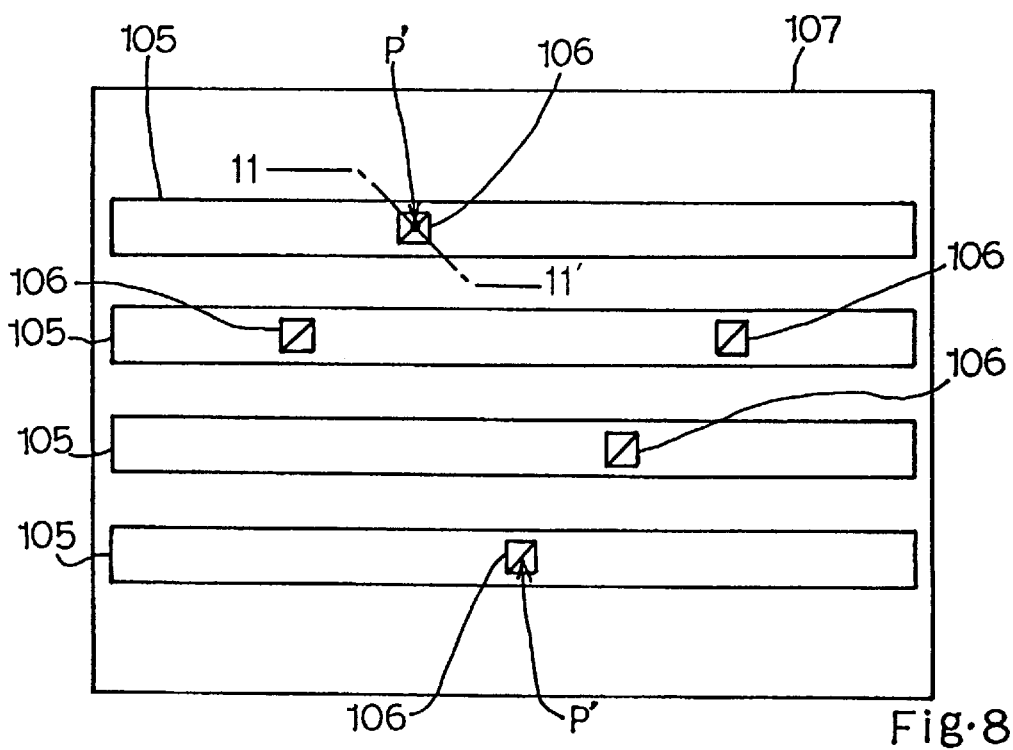
FIG. 8 is a plan view showing the relation between bit lines, bit contact holes and a plate electrode incorporated in the semiconductor dynamic random access memory device.

FIG. 8 illustrates the relation between bit lines 105, bit contact holes 106 and a plate electrode 107. The bit lines 105 extend in parallel to one another, and are perpendicular to the word lines 102. When points P' are overlapped with points P, the active areas 101, the word lines 102, the bit lines 105, the node contact holes 103, the bit contact holes 106 and the plate electrode 107 form a layout for a folded bit line type memory cell array.

The core pattern 104 is implemented by a plurality of mask strips, which are also labeled with 104 in the following description. The mask strip 104 has the minimum dimensions achieved by using a lithography and a dry etching technique presently available for the fabrication thereof, and a multiple cylindrical storage electrode is patterned outside of the mask strip 104. The mask strips 104 are offset from the node contact holes 103, respectively, and the center of each mask strip 104 is spaced from the centers of adjacent mask strips 104 by a certain distance. For example, the mask strip 104(A) is equally spaced from the adjacent four mask strips 104(B). This results in the storage electrodes densely arranged over the bit lines 105.

Figure 9:
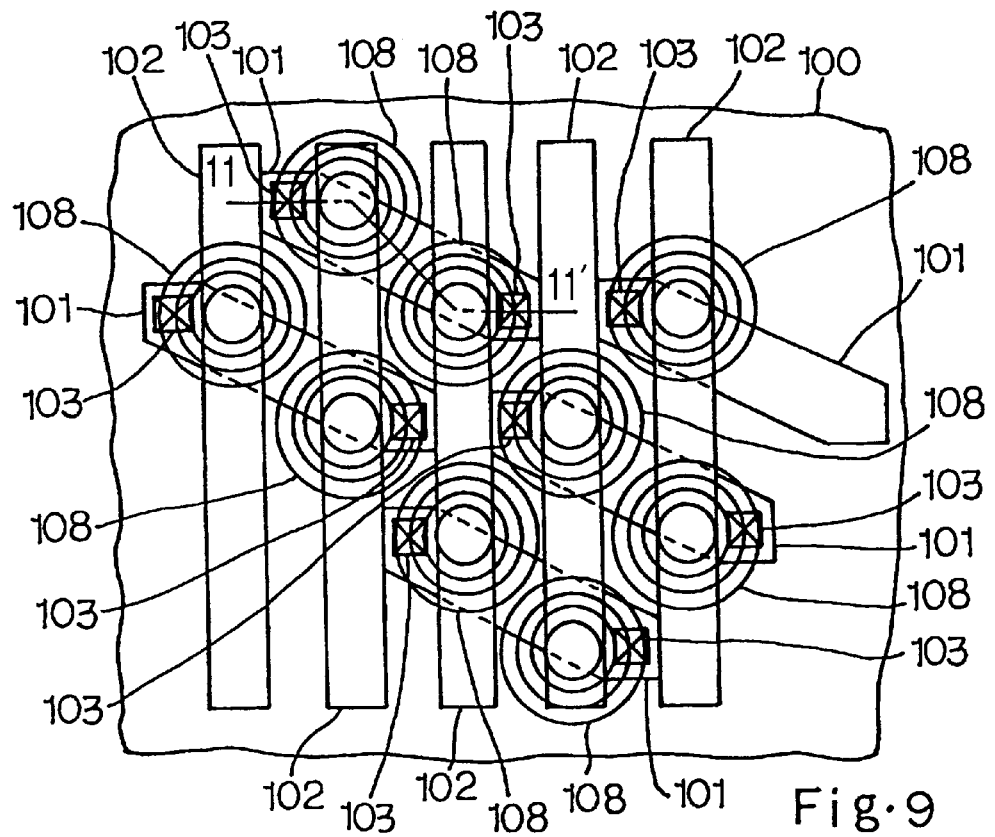
FIG. 9 is a plan view showing a layout of double cylindrical portions of storage electrodes incorporated in the semiconductor dynamic random access memory device.
Figure 10:
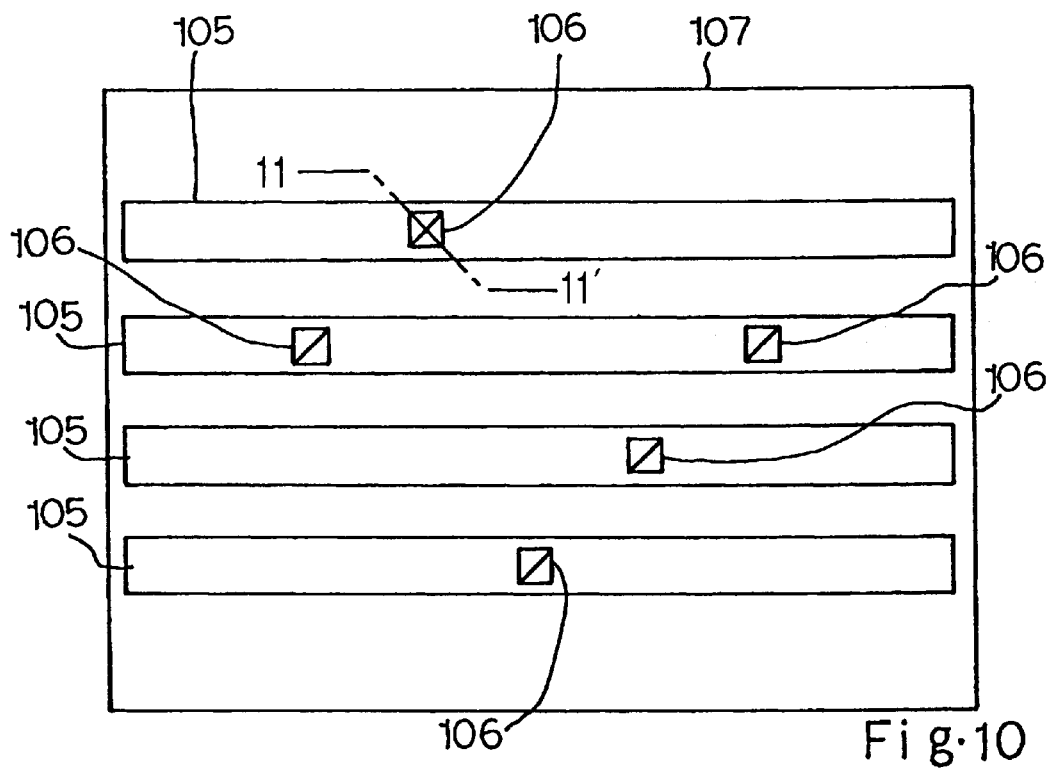
FIG. 10 is a plan view showing the layout of the bit contacts of the semiconductor dynamic random access memory device.

When the storage electrodes are completed, the folded bit line type memory cell array has the layout as shown in FIGS. 9 and 10. The mask strips 104 are rounded at the corners, and a plurality of double cylindrical portions 108 are respectively formed outside of the modified mask strips 104. For this reason, the center of each double cylindrical portion 108 is offset front the center of the associated node contact hole 103. However, the double cylindrical portion 108 is integral with a boss portion of the storage electrode passing through the node contact hole 10 3, and is electrically connected to the end portion of the active area 101 serving as a source region of an n-channel enhancement type switching transistor, which forms a memory cell together with a stacked capacitor as will be described hereinbelow.

Figure 11:
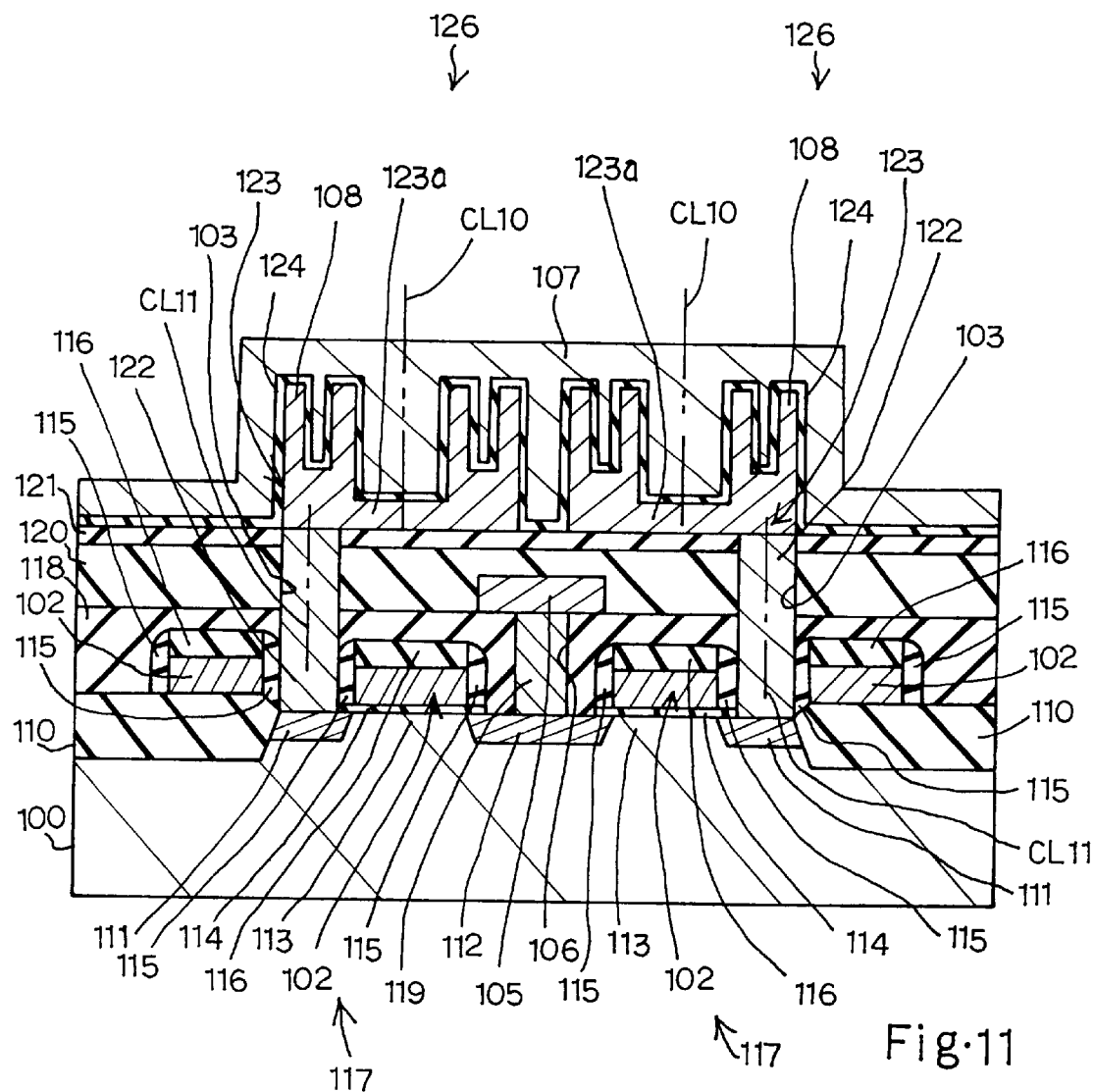
FIG. 11 is a cross sectional view taken along line A–A' of FIGS. 7 to 10 and showing the structure of memory cells incorporated in the semiconductor dynamic random access memory device.

FIG. 11 illustrates a pair of memory cells fabricated on one of the active areas 101 defined by a thick field oxide layer 110. The thick field oxide layer 110 is selectively grown on the major surface of the p-type silicon substrate 100 by using the LOCOS (Localized Oxidation of Silicon). N-type source regions 111 and an n-type drain region 112 are formed in the active area 101, and channel regions 113 space the n-type source regions 111 from the n-type drain region 112. The channel regions 113 are covered with gate insulating layers 114 of silicon oxide, respectively, and the word lines 102 extend over the gate insulating layers 114. Side wall spacers 115 are formed on the side surfaces of the word lines 102, and the word lines 1 02 are overlain by silicon oxide layers 116. The parts of the word lines 102 on the gate insulating layers 114 serve as gate electrodes, and the gate electrode 102, the gate insulating layer 114, the source region 111 and the drain region 112 as a whole constitute the n-channel enhancement type switching transistor 117.

The n-channel enhancement type switching transistors 117 are covered with a first inter-level insulating layer 118 of silicon oxide. The bit contact hole 106 is formed in the first inter-level insulating layer 118, and the bit contact hole 106 is filled with an n-type polysilicon plug 119. The bit line 105 extends over the first inter-level insulating layer 118, and is held in contact with the n-type polysilicon plug 119. Thus, the bit line 106 is electrically connected through the n-type polysilicon plug 119 to the n-type drain region 112.

The bit line 105 is covered with a second inter-level insulating layer 120 of silicon oxide. The second inter-level insulating layer 120 is overlain by a stopper layer 121 of silicon nitride, and the node contact holes 103 pass through the stopper layer 121, the second inter-level insulating layer 120 and the first inter-level insulating layer 118. The n-type source regions 111 are exposed to the node contact holes 103. N-type polysilicon plugs 122 fill the node contact holes 103, respectively, and the storage electrodes 123 are formed on the stopper layer 121 in such a manner as to be held in contact with the n-type polysilicon plugs 122. The storage electrode 123 has a base portion 123a held in contact with the n-type polysilicon plug 122 and the double cylindrical portion 108 projecting from the base portion 123a. The double cylindrical portion 108 has an outer cylinder and an inner cylinder inserted into the outer cylinder, and the base portion 123a is exposed to the inner space of the inner cylinder. The inner space was filled with the mask strip 104. The double cylinder portion 108 has a center line CL10 offset from the center line CL11 of the n-type polysilicon plug 122.

The storage electrodes 123 are covered with dielectric film structures 124, and the plate electrode 107 is opposed through the dielectric film structures 124 to the storage electrodes 123. A silicon oxide film and a silicon nitride film form the dielectric film structure 124, and the dielectric film structure 124 is equivalent to a silicon dioxide layer of 4–5 nanometers thick. The storage electrode 123, the dielectric film structure 124 and the plate electrode 107 as a whole constitute a storage capacitor 126, and the n-channel enhancement type switching transistor 117 and the storage capacitor 126 form in combination each memory cell of the pair.

As described hereinbefore, the mask strip 104 was inside of the inner cylinder, and was defined by the minimum dimension. The outer diameter of the base portion 123a is much longer than the minimum dimension, and allows the double cylindrical portion 108 to occupy on the base portion 123a. The double cylindrical portion 108 is achieved by virtue of the offset layout between the node contacts 103 and the double cylindrical portions 108.

Figure 1:
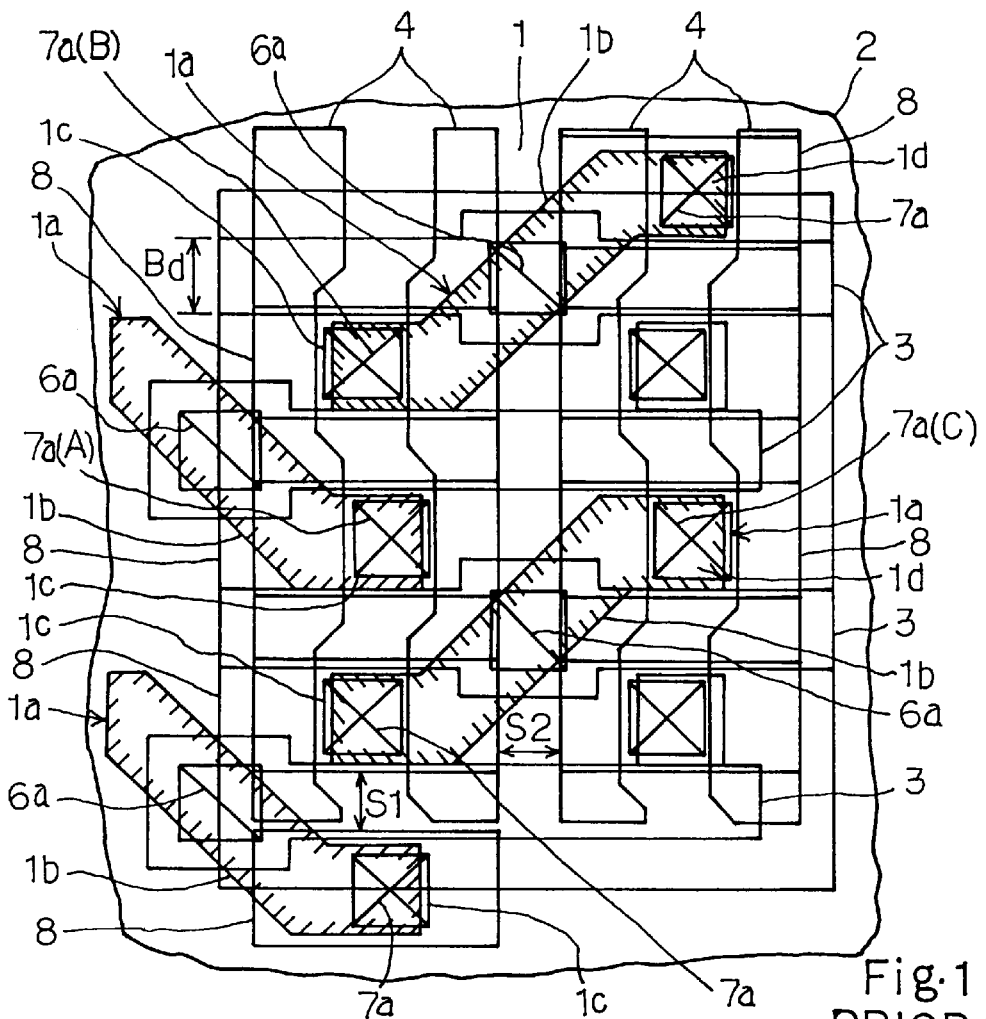
FIG. 1 is a view showing the layout of the first prior art capacitor over bit-line cells.
Figure 2:
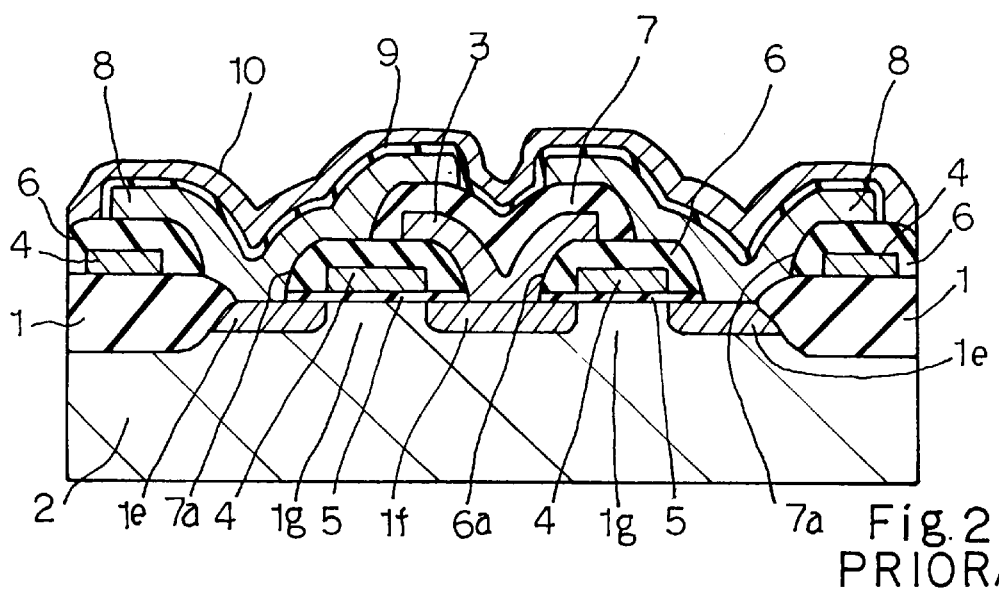
FIG. 2 is a cross sectional view showing the structure of the first prior art capacitor over bit-line cells.
Figure 3:
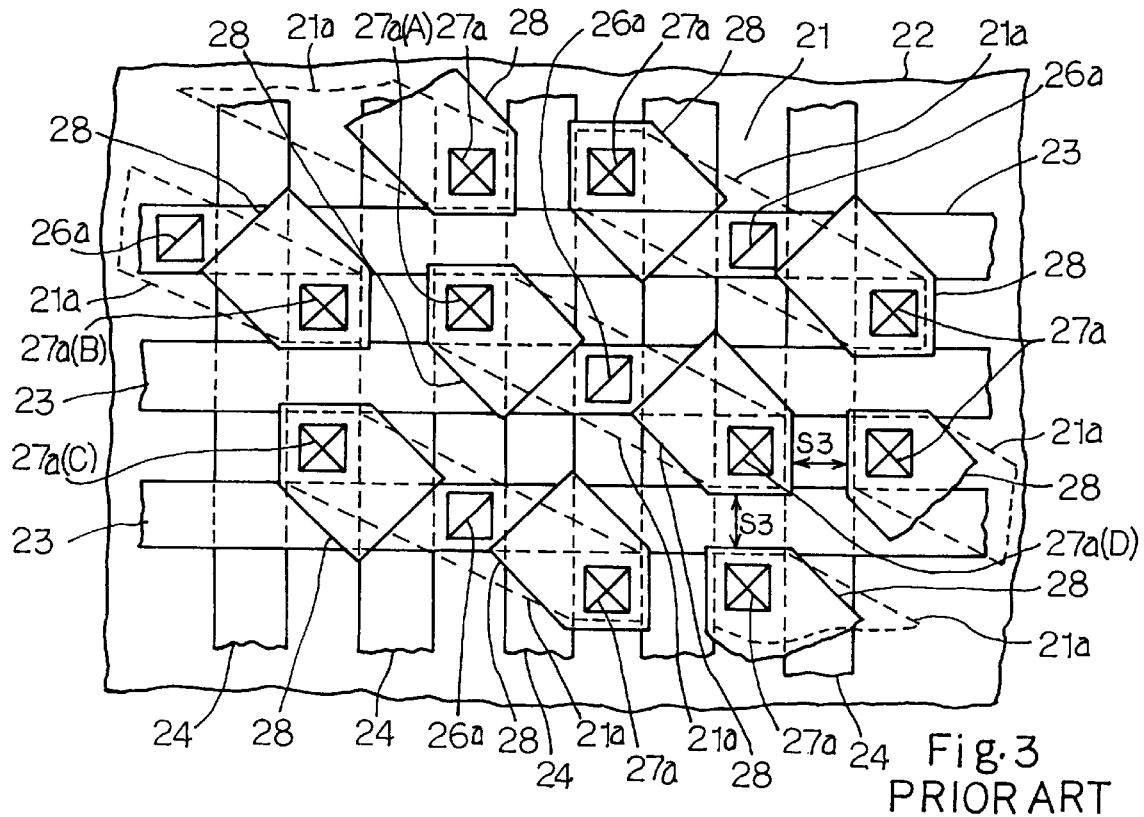
FIG. 3 is a plan view showing the layout of the second prior art capacitor over bit-line cells.
Figure 4:
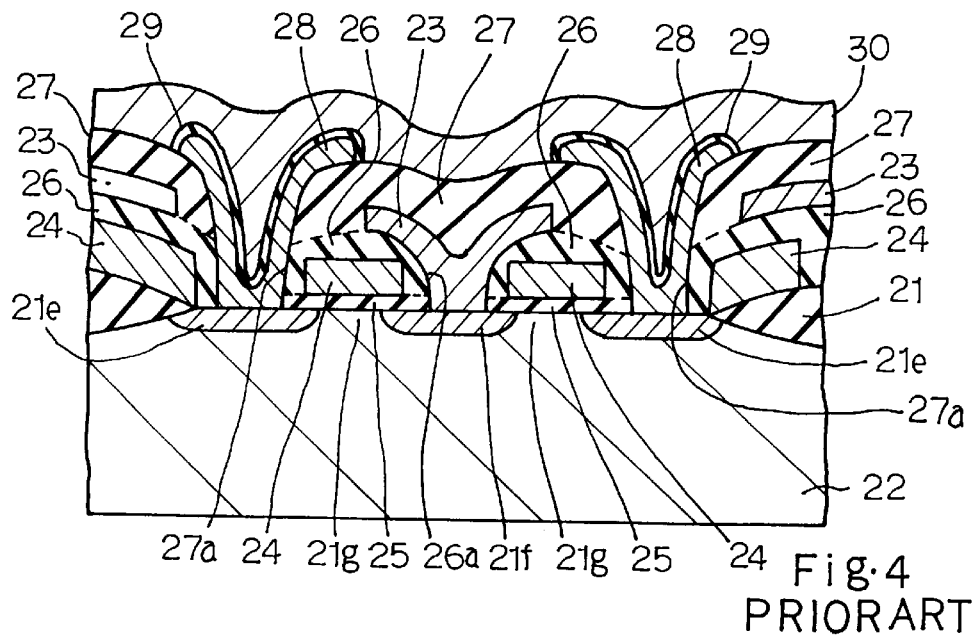
FIG. 4 is a cross sectional view showing the structure of the second prior art capacitor over bit-line cells.

The present inventor evaluated the storage capacitor 126. The Storage capacitors 126 were arranged as shown in FIG. 9, and the dielectric film structure was equivalent to the silicon dioxide layer of 4 nanometers thick. The present inventor further prepared the array of the storage capacitors incorporated in the first prior art capacitor over bit-line cells shown in FIG. 1 and the array of the storage capacitors incorporated in the second prior art capacitor over bit-line cells shown in FIG. 3. The present inventor varied the height of the storage electrodes, and measured the capacitance. The capacitance was proportionally varied together with the height of the storage electrode. The storage capacitor of the first capacitor over bit-line cell varied the capacitance Cs along plots PL1, and the storage capacitor of the second capacitor over bit-line cell varied the capacitance Cs along plots PL2. The storage capacitor 126 increased the capacitance Cs along plots PL3.

The storage capacitor of 1 giga-bit dynamic random access memory cell was expected to have 30 fF as indicated by real line RL. Even though the height was increased to 0.8 microns, the storage capacitors of the first/second capacitor over bit-line cells did not reach 30 fF. However, the storage capacitor PL3 exceeded 30 fF before reaching 0.6 micron high. Thus, the double cylindrical storage electrode 108 offset from the node contact achieved large capacitance Cs.

Description is hereinbelow made on a process for fabricating the dynamic random access memory cell according to the present invention with reference to FIGS. 13A to 13L.

The process starts with preparation of the p-type silicon substrate 100, and the thick field oxide layer 110 is selectively grown to 200 nanometers thick on the major surface of the p-type silicon substrate 100 by using the LOCOS technique. The thick filed oxide layer 110 defines the active area 101 in the major surface, and the active area 101 is thermally oxidized so as to form the gate insulating layer 114 of silicon dioxide. The gate insulating layer 114 is of the order of 6 nanometers thick.

Figure 13A:
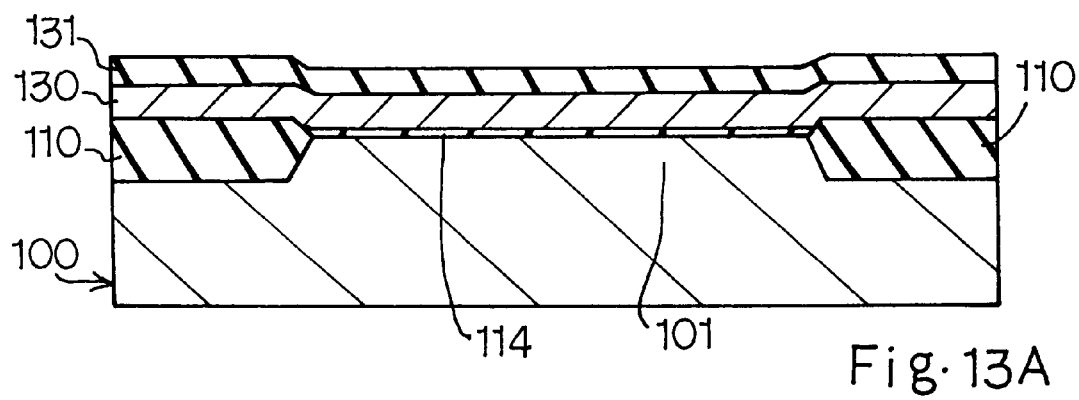
FIGS. 13A to 13L are cross sectional views showing a process of fabricating the memory cell incorporated in the semiconductor dynamic random access memory device according to the present invention.

Subsequently, polysilicon is deposited over the entire surface of the resultant semiconductor structure to 100 nanometers thick by using a chemical vapor deposition, and n-type dopant impurity such as phosphorous is ion implanted into the polysilicon layer 130. Silicon dioxide is deposited to 130 nanometers thick over the n-type doped polysilicon layer 130 by using a chemical vapor deposition, and the n-type doped polysilicon layer 130 is overlain by a silicon dioxide layer 131 as shown in FIG. 13A.

Photo-resist solution is spun onto the entire surface of the silicon dioxide layer 131, and is baked into a photo-resist layer (not shown). A pattern image for the word lines 102 is transferred from a reticle (not shown) to the photo-resist layer, and a latent image is formed in the photo-resist layer. The latent image is developed, and the photo-resist layer is patterned into a photo-resist etching mask (not shown). Thus, the photo-resist etching mask is formed of the photo-resist by using lithographic techniques.

Using the photo-resist etching mask, the silicon dioxide layer 131 and the n-type doped polysilicon layer 130 are selectively etched away so as to form the word lines 102 and the silicon oxide layers 116.

Figure 13B:
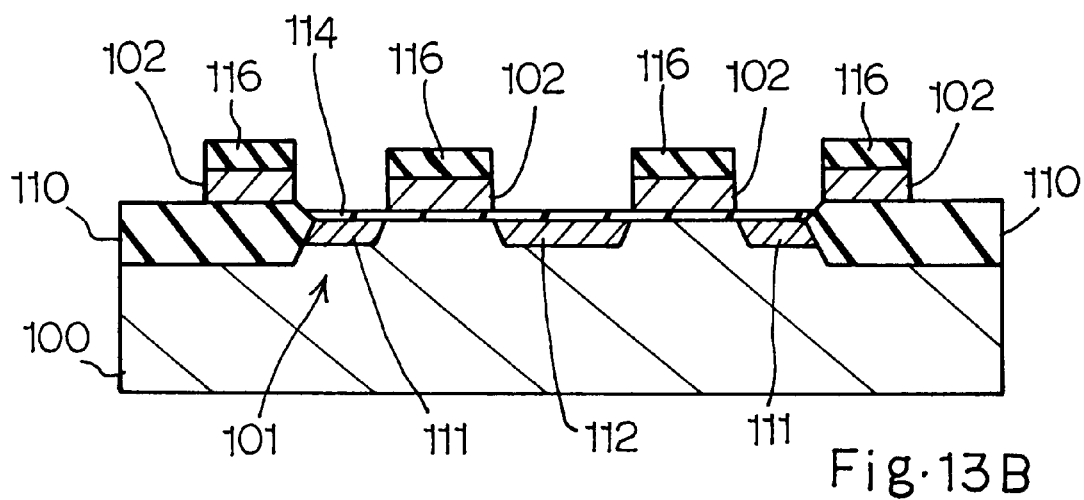

N-type dopant impurity such as phosphorous is ion implanted into the active area 101 at dose of $2 \times 10^{13}$ /cm$^2$ under acceleration energy of 20 KeV, and forms the n-type source regions 111 and the n-type drain region 112 in the active area 101 as shown in FIG. 13B.

Figure 13C:
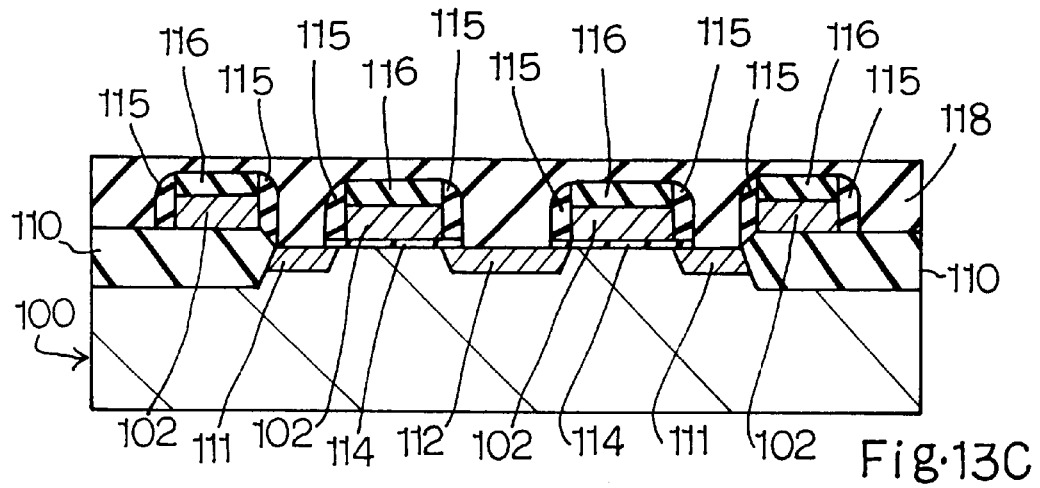

Subsequently, silicon dioxide is deposited to 50 nanometers thick over the resultant semiconductor structure by using the chemical vapor deposition, and the silicon dioxide layer is anisotropically etched so as to form the side wall spacers 115. Silicon dioxide is deposited to 500 nanometers thick over the entire surface of the resultant semiconductor structure, again, and a smooth top surface is created on the first inter-level insulating layer 118 by using an etch-back technique as shown in FIG. 13C.

A photo-resist etching mask (not shown) is formed on the first inter-level insulating layer 118 by using the lithographic techniques, and an area over the n-type drain region 112 is exposed to an opening of the photo-resist etching mask. The first inter-level insulating layer 118 is selectively etched away so as to form the bit contact hole 105 in the first inter-level insulating layer 118, and the n-type drain region 112 is exposed to the bit contact hole 105.

N-type doped polysilicon is deposited to 250 nanometers thick over the entire surface of the resultant semiconductor structure by using the chemical vapor deposition, and the doped polysilicon layer is uniformly etched without any mask until the first inter-level insulating layer 118 is exposed again. Then, the n-type doped polysilicon plug 119 is left in the bit contact hole 105.

Figure 13D:
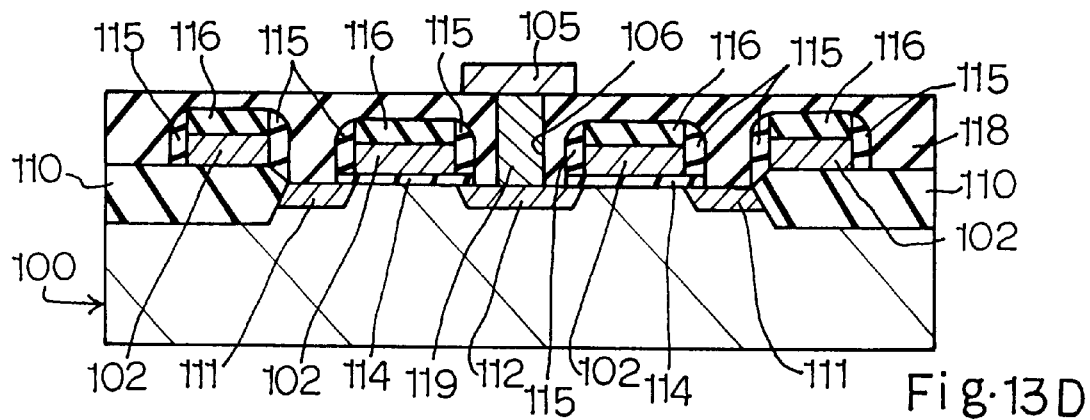

Tungsten silicide is deposited to 100 nanometers thick over the entire surface of the resultant semiconductor structure by using a sputtering, and a photo-resist etching mask (not shown) is patterned on the tungsten silicide layer. The tungsten silicide layer is selectively etched away so as to form the bit line 105 on the first inter-level insulating layer 118 as shown in FIG. 13D.

Subsequently, silicon dioxide is deposited over the entire surface of the resultant semiconductor structure by using the chemical vapor deposition, and forms the second inter-level insulating layer 120. Silicon nitride is deposited over the second inter-level insulating layer 120 by using a chemical vapor deposition, and forms the stopper layer 121.

A photo-resist etching mask is formed on the stopper layer 121 by using the lithographic techniques, and the stopper layer 121, the second inter-level insulating layer 120 and the first inter-level insulating layer 118 are selectively etched away so as to form the node contact holes 103. The n-type source regions 111 are exposed to the node contact holes 103.

Figure 13E:
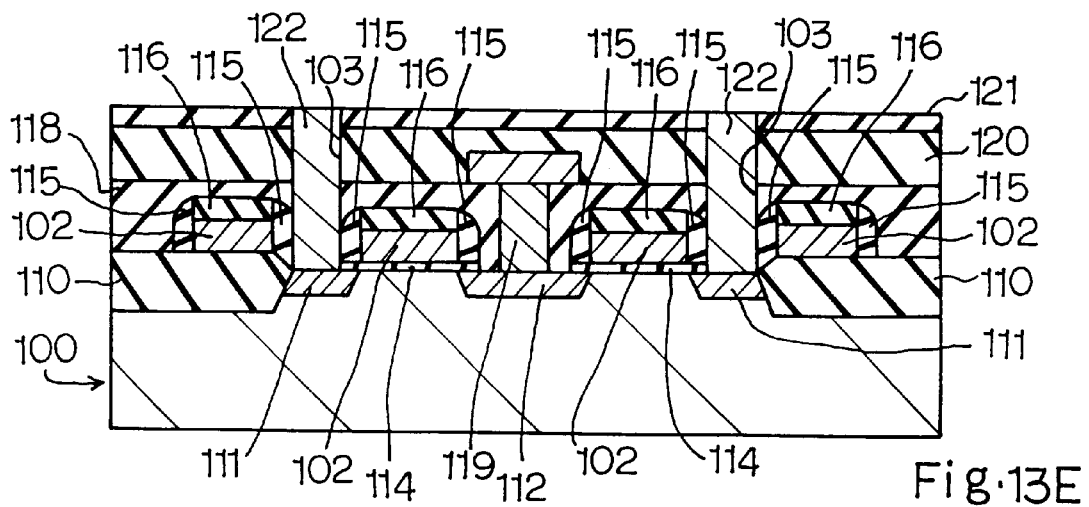

Doped polysilicon is deposited to 400 nanometers thick over the entire surface of the resultant semiconductor structure by using the chemical vapor deposition. The doped polysilicon fills the node contact holes 103, and swells into a doped polysilicon layer. The doped polysilicon layer is uniformly etched without an etching mask, and the n-type doped polysilicon plugs 122 are left in the node contact holes 103 as shown in FIG. 13E. In the above step, side wall spacers may be formed from a silicon dioxide layer between the formation of the node contact holes 103 and the deposition of the doped polysilicon so as to decrease the diameter of the node contact holes 122.

Figure 13F:
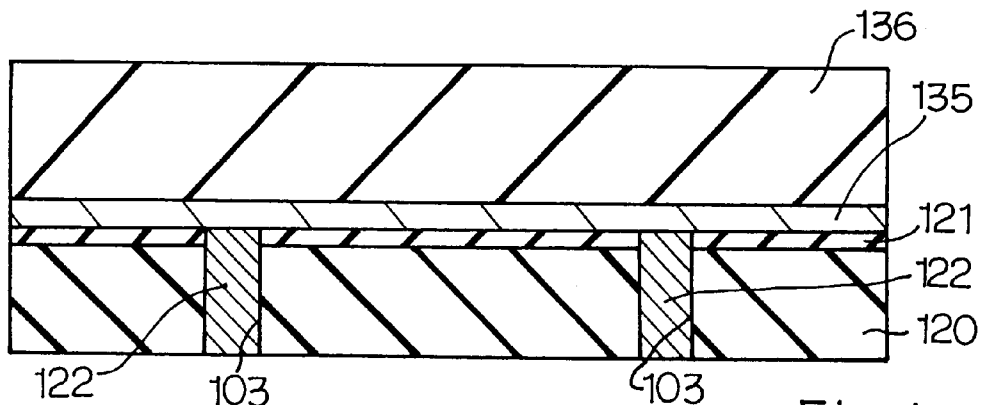

After the formation of the doped polysilicon plugs 122, the storage capacitor 126 is fabricated on the stopper layer 121, and the lower sub-structure under the second inter-level insulating layer is deleted from FIGS. 13F to 13L for the sake of simplicity. Doped polysilicon is deposited over the stopper layer 121 by using the chemical vapor deposition, and the stopper layer 121 is overlain by a doped polysilicon layer 135. Thereafter, silicon dioxide is deposited over the doped polysilicon layer 135, and the doped polysilicon layer 135 is overlain by a silicon dioxide layer 136 as shown in figure 13F.

Figure 13G:
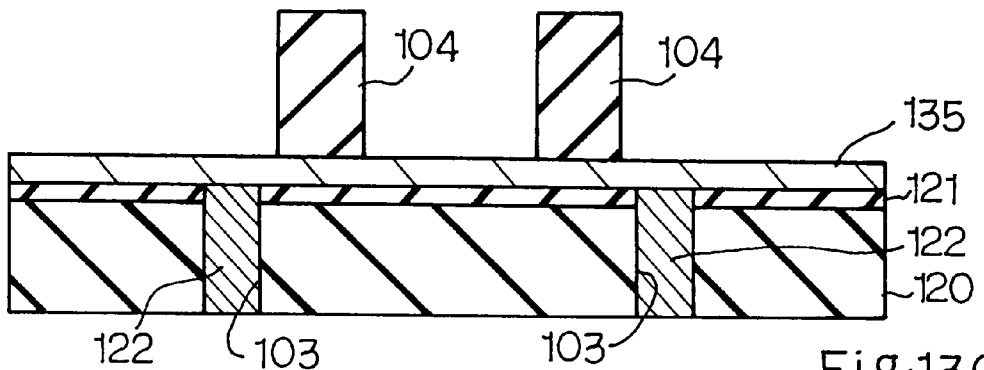

A photo-resist etching mask (not shown) is patterned on the silicon dioxide layer 136, and the silicon dioxide layer 136 is selectively etched away for forming the mask strips 104. The mask strips 104 have the minimum dimensions achieved by using the lithographic techniques and the etching techniques presently available for actual fabrication processes. While the silicon dioxide layer 136 is being etched, the etching proceeds faster at the corners of the mask strips 104, and the corners of the mask strips 104 are rounded. The resultant semiconductor structure at this stage is illustrated in FIG. 13G.

Figure 13H:
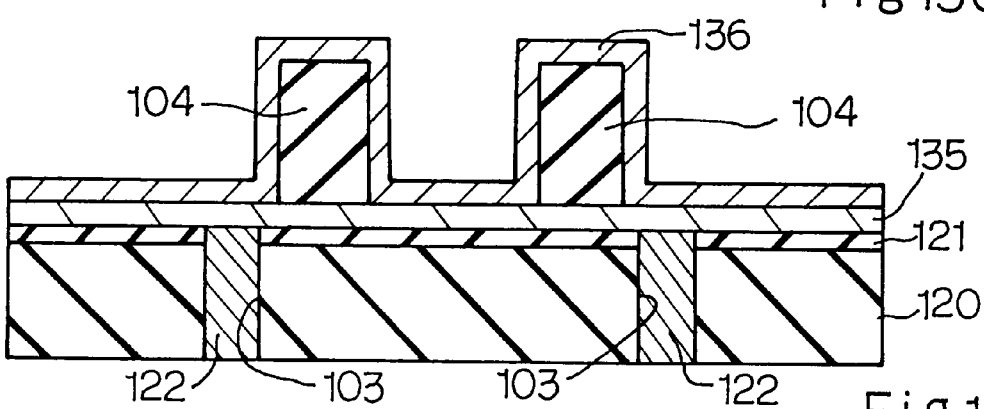

Subsequently, n-type doped polysilicon is deposited over the entire surface of the resultant semiconductor structure by using the chemical vapor deposition, and an n-type doped polysilicon layer 136 conformably extends over the resultant semiconductor structure as shown in figure 13H.

Figure 13I:
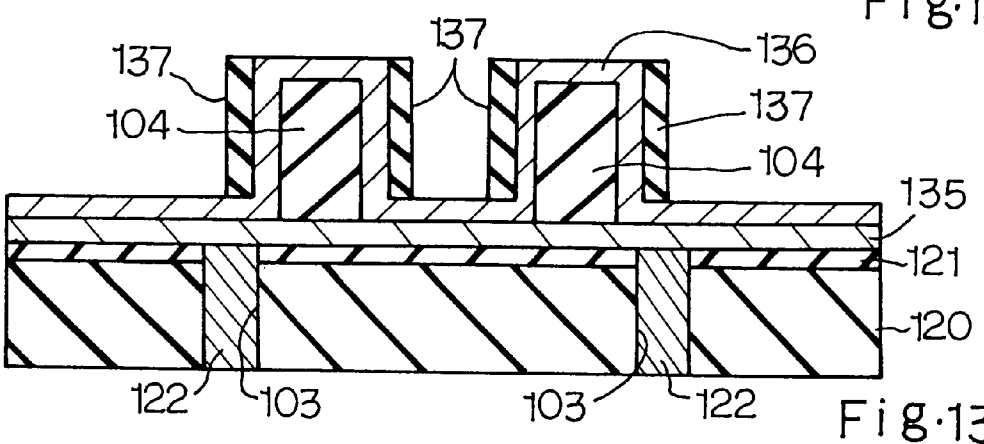

Silicon dioxide is deposited over the entire surface of the resultant semiconductor structure by using the chemical vapor deposition, and a silicon dioxide layer conformably extends over the n-type doped polysilicon layer 136. The silicon dioxide layer is uniformly etched away without an etching mask, and side wall spacers 137 are left on the side surfaces of the n-type doped polysilicon layer 136 as shown in FIG. 13I.

Figure 13J:
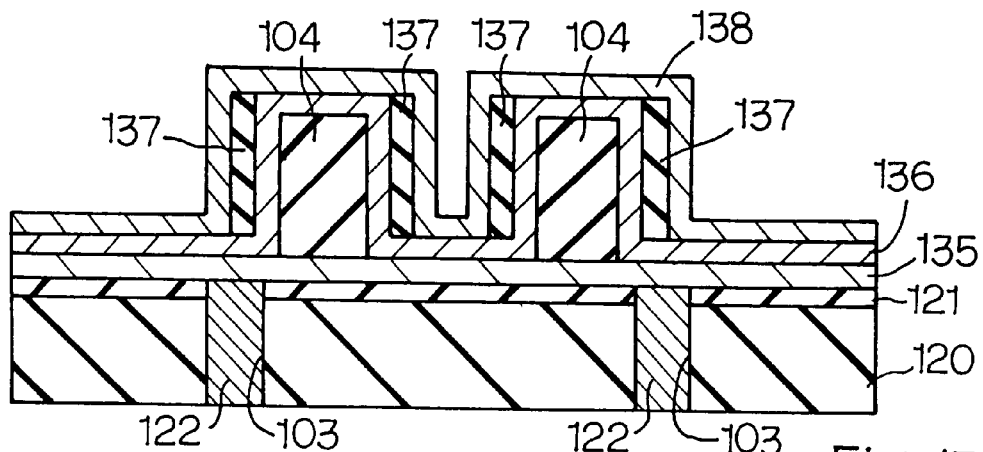
Figure 13K:
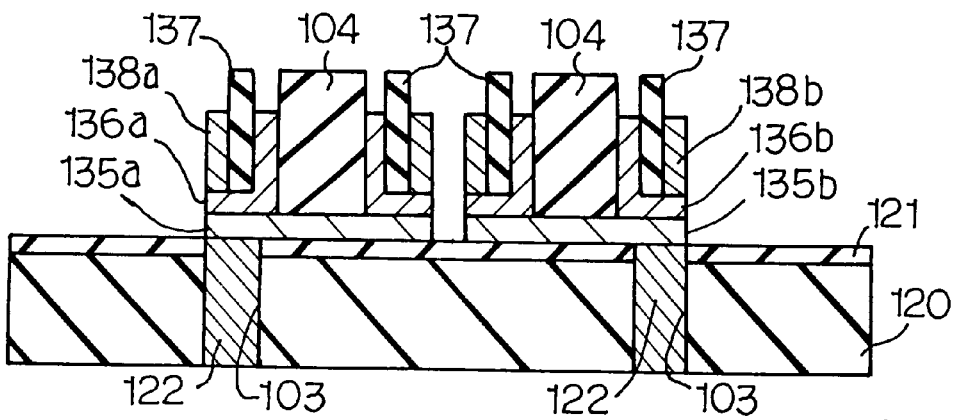

N-type doped polysilicon is deposited over the entire surface of the resultant semiconductor structure, and an n-type doped polysilicon layer 138 conformably extends as shown in FIG. 13J. The n-type doped polysilicon layers 138, 136 and 135 are etched away without an etching mask until the stopper layer 121 is exposed again. The n-type doped polysilicon layers 138, 136 and 135 are patterned into n-type doped polysilicon strips 135*a*/135*b*, inner cylindrical members 136*a*/136*b* and outer cylindrical members 138*a*/138*b*, respectively, as shown in FIG. 13K.

Figure 13L:
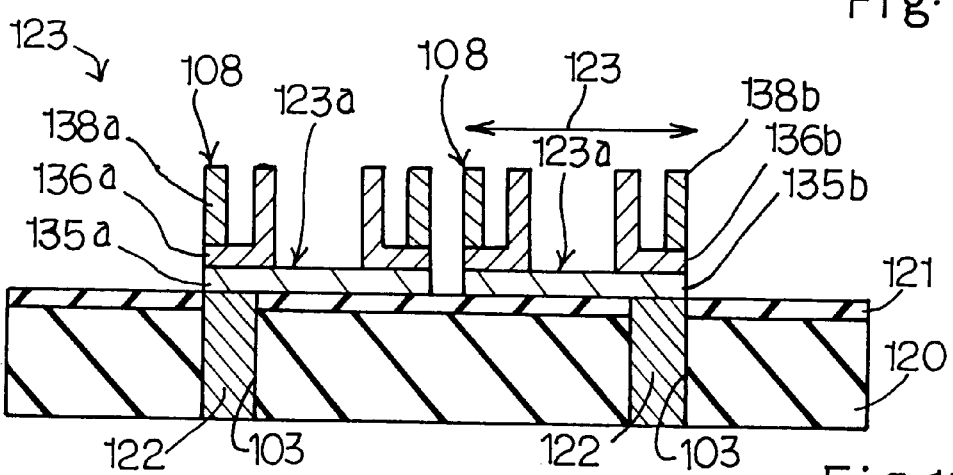

The side wall spacers 137 of silicon dioxide and the mask strips 104 of silicon dioxide are etched away in hydrofluoric solution as shown in FIG. 13L. The n-type doped polysilicon strips 135a/135b and parts of the inner cylindrical members 136a/136b form the base portions 123a, and the remaining parts of the inner cylindrical members 136a/136b serve as the inner cylinders. The outer cylindrical members 138a/138b serve as the outer cylinders, and the inner/outer cylinders as a whole constitute the multiple cylindrical portions 108. The base portion 123a and the multiple cylindrical portion 108 form in combination the storage electrode 123, and each storage electrode 123 is surely isolated from the adjacent storage electrode by sufficiently etching the doped polysilicon layers 135/138.

The dielectric film structure 124 covers the storage electrodes 123, and the plate electrode 107 is opposed to the storage electrodes 123 through the dielectric film structures 124.

As will be understood from the foregoing description, the memory cells are formed on the active area through the process sequence described hereinbefore.

Second Embodiment

Figure 14:
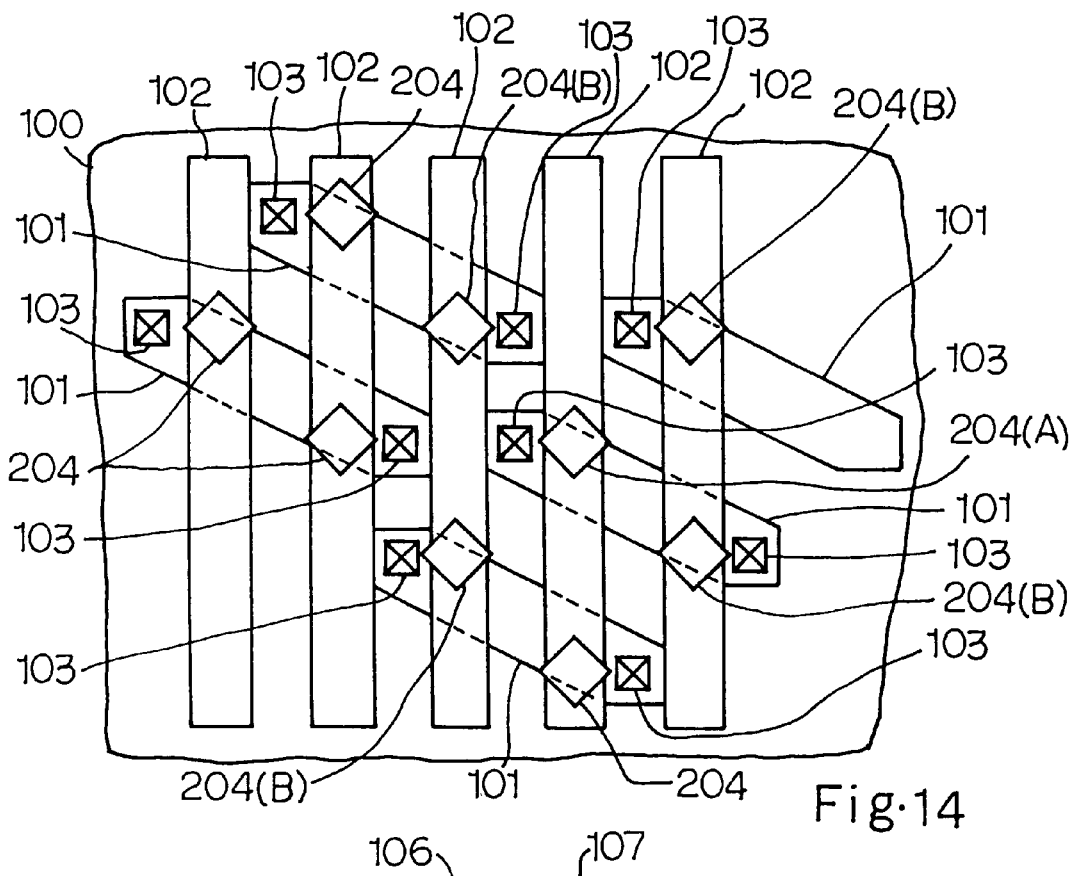
FIG. 14 is a plan view showing another layout of word lines, active areas, node contact holes and mask strips incorporated in another semiconductor memory device according to the present invention.
Figure 15:
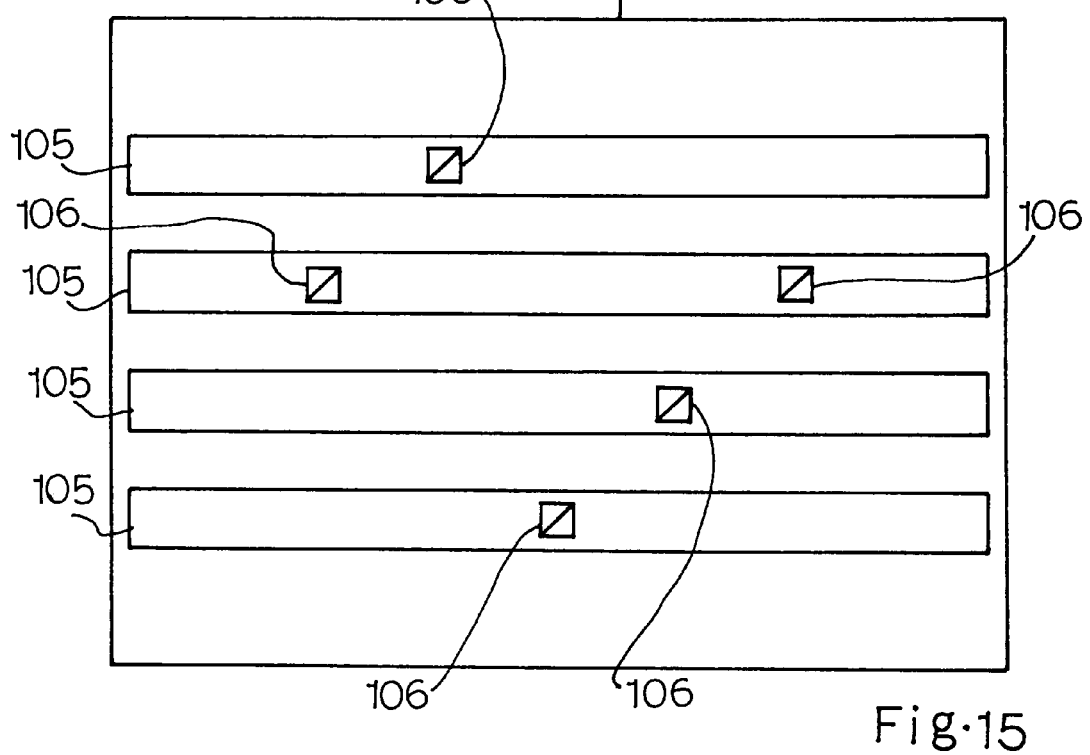
FIG. 15 is a plan view showing a layout of bit lines, bit contact holes and a plate electrode incorporated in the semiconductor memory device.

FIGS. 14 and 15 illustrate another layout of a memory cell array embodying the present invention. Layers, areas, contact holes and signal lines of the memory cell array shown in FIGS. 14 and 15 are labeled with the same references designating the corresponding layers, areas, contact holes and signal lines of the first embodiment. The arrangement for the active areas 101, the word lines 102, the node contact holes 103 and mask strips 204 is illustrated in FIG. 14, and the arrangement for the bit lines 105, the bit contact holes 106 and the plate electrode 107 is illustrated in FIG. 15. For this reason, when the feature shown in FIG. 15 is registered with the feature shown in FIG. 14, the composite figure illustrates the layout of the memory cell array. The semiconductor memory device implementing the second embodiment is similar to the first embodiment except for the orientation of the mask strips 204. In the first embodiment, the mask strip 104 has the side lines parallel to the word lines 102 and the end lines parallel to the bit lines 105. However, the mask strips 204 turn at 45 degrees, and each mask strip 204 is equally spaced from adjacent four mask strips 204. For example, the mask strip 204(A) is equally spaced from the adjacent four mask strips 204(B). Comparing FIG. 14 with FIG. 7, the distance between the mask strip 204(A) and the adjacent four mask strips 204(B) is longer than the distance between the mask strip 104(A) and the adjacent four mask strips 104(B). For this reason, even if the corners of the mask strip 204 are insufficiently rounded, the distance becomes longer that that of the first embodiment, and the long distance prevents the storage electrodes 123 from short-circuit. Otherwise, a triple cylindrical portion is formed on the base portion 123a.

Third Embodiment

Figure 16:
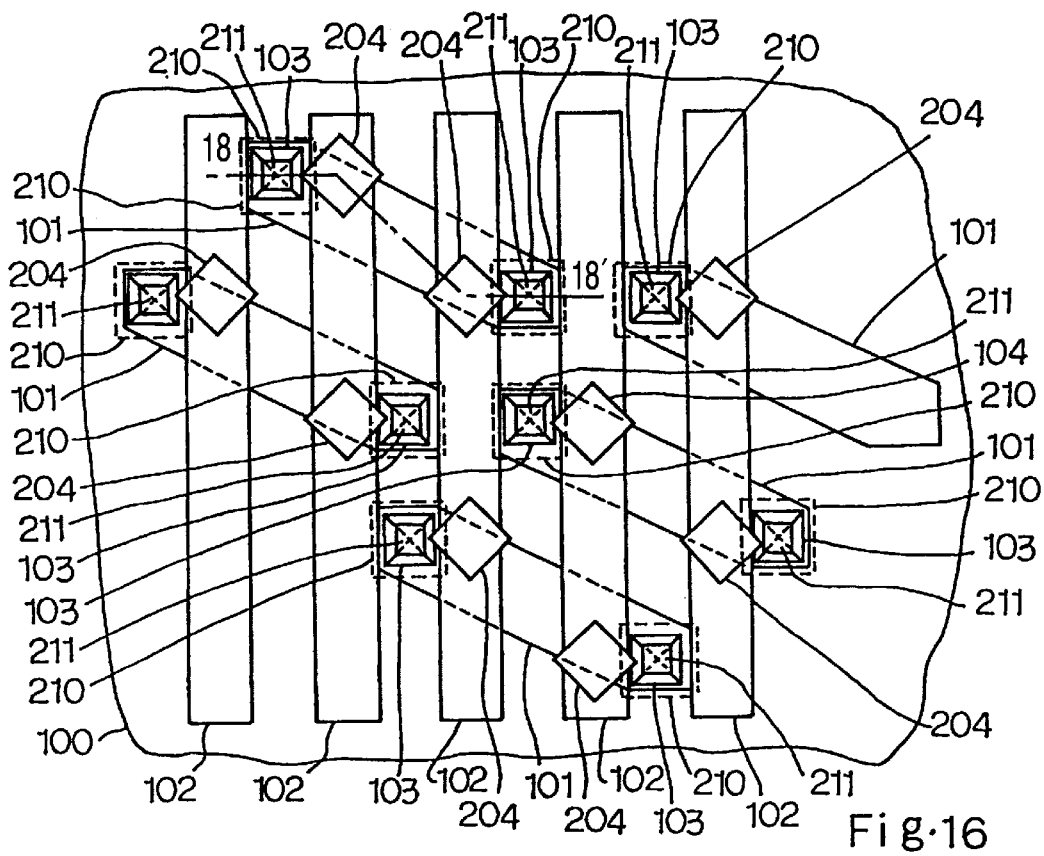
FIG. 16 is a plan view showing a layout of word lines, active areas, node contact holes and mask strips incorporated in yet another semiconductor memory device according to the present invention.
Figure 17:
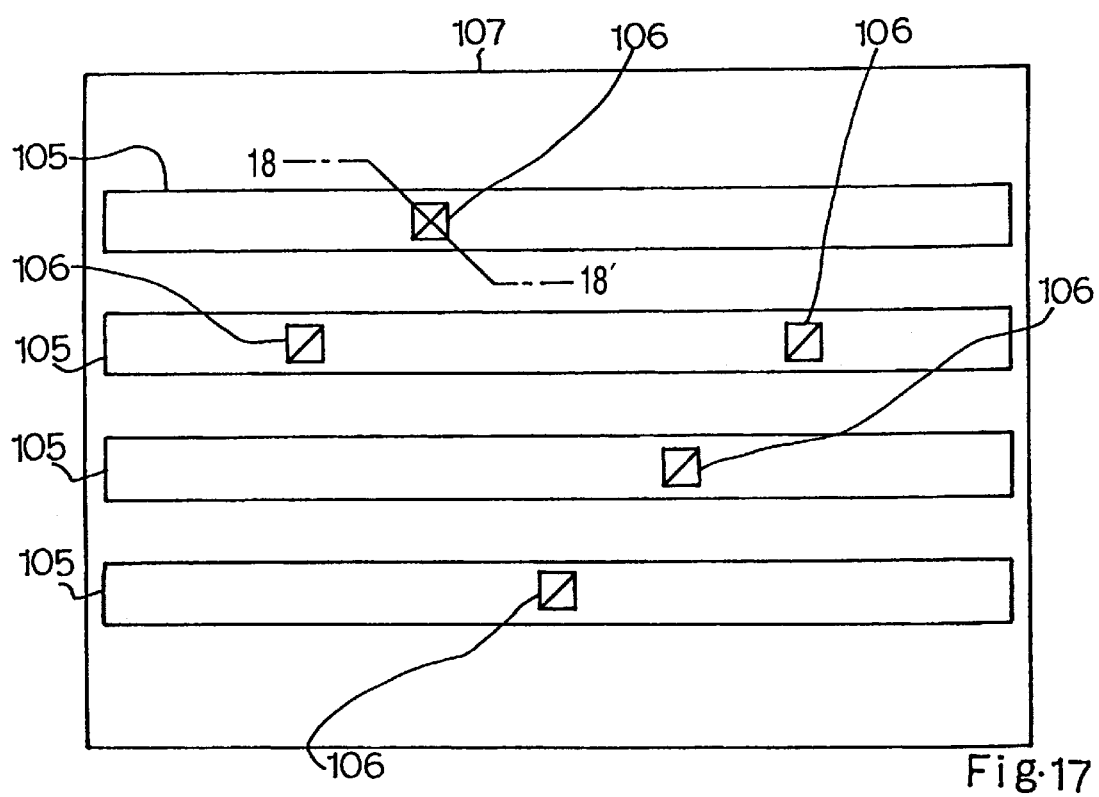
FIG. 17 is a plan view showing a layout of bit lines, bit contact holes and a plate electrode incorporated in the semiconductor memory device.
Figure 18:
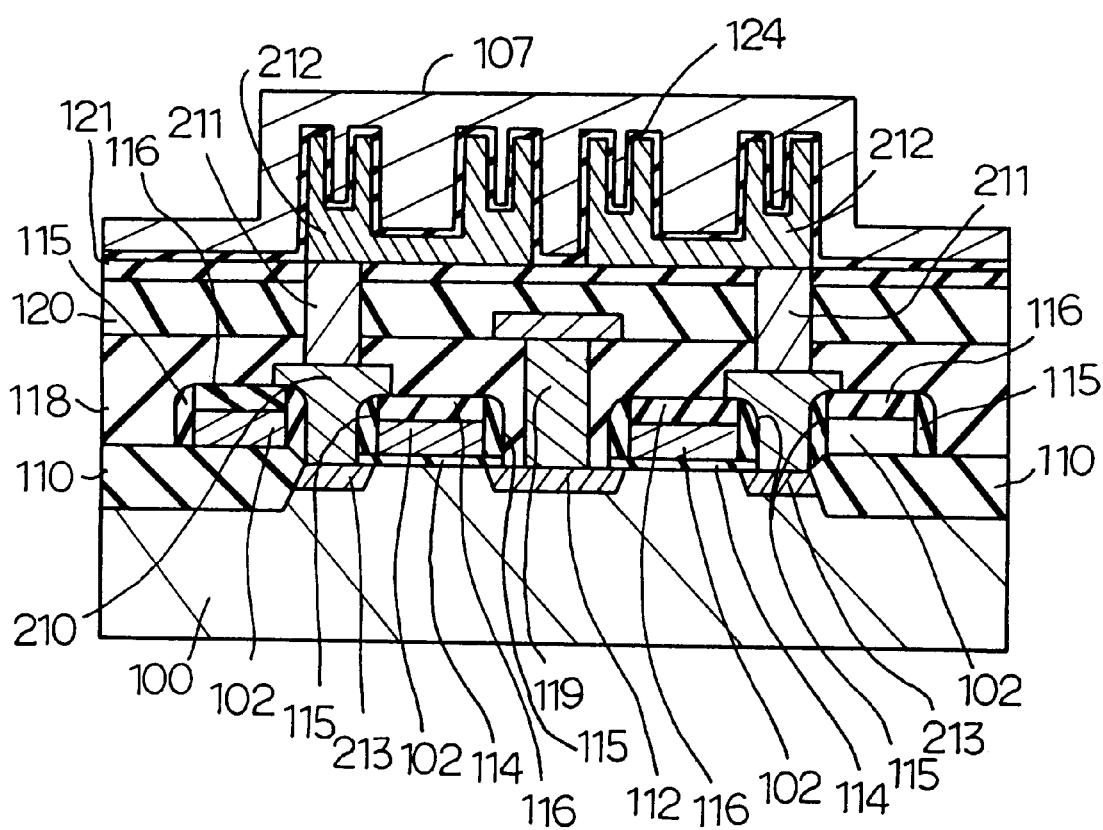
FIG. 18 is a cross sectional view taken along line A–A' of FIGS. 16 and 17 and showing the structure of a pair of memory cells incorporated in the semiconductor memory device.

FIGS. 16 and 17 illustrate a layout of a memory cell array incorporated in yet another semiconductor memory device embodying the present invention. Layers, areas, contact holes and signal lines of the memory cell array shown in FIGS. 16 and 17 are labeled with the same references designating the corresponding layers, areas, contact holes and signal lines of the second embodiment. The arrangement for the active areas 101, the word lines 102, the node contact holes 103 and the mask strips 204 is illustrated in FIG. 16, and the arrangement for the bit lines 105, the bit contact holes 106 and the plate electrode 107 is illustrated in FIG. 15. For this reason, when the feature shown in FIG. 17 is registered with the feature shown in FIG. 16, the composite figure illustrates the layout of the memory cell array. The semiconductor memory device implementing the third embodiment is similar to the second embodiment except for conductive pad layers 210. The conductive pad layers 210 are wider than the node contact holes 103, and have a similar configuration to the node contact holes 103. The conductive pad layers 210 are placed on the contact portions of the active areas 101, and polysilicon plugs 211 fills the node contact holes 103, and a multiple cylindrical storage electrodes 212 are electrically connected through the polysilicon plugs 211 and the conductive pad layers 210 to the source regions 213 in the active areas 101 as shown in FIG. 18. The other layers, regions and signal lines are labeled with the same references as those of the first embodiment shown in FIG. 11. The conductive pad layers 210 improve the aspect ratio of the node contact holes 103, and prevent the polysilicon plugs 211 from undesirable connection to the word lines 102. Thus, the conductive pad layers 210 make the fabrication process easy, and enhance the reliability of the semiconductor memory device.

Fourth Embodiment

Figure 19:
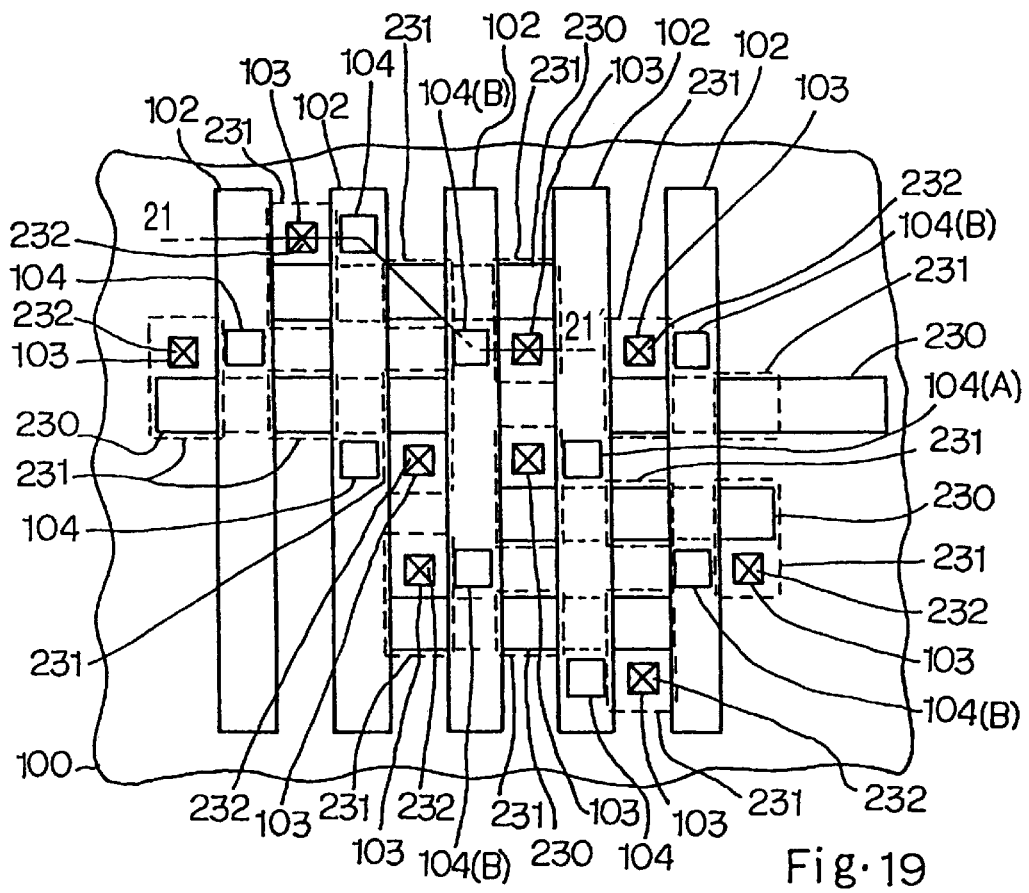
FIG. 19 is a plan view showing a layout of word lines, active areas, node contact holes and mask strips incorporated in still another semiconductor memory device according to the present invention.
Figure 20:
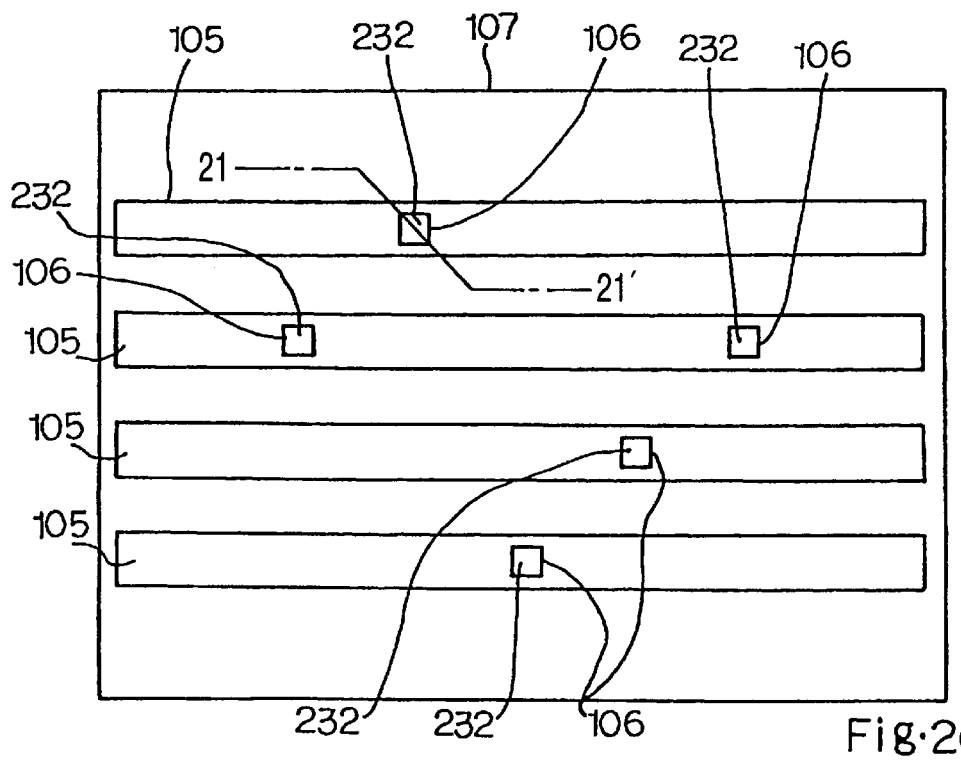
FIG. 20 is a plan view showing a layout of bit lines, bit contact holes and a plate electrode incorporated in the semiconductor memory device.

FIGS. 19 and 20 illustrate a layout of a memory cell array incorporated in still another semiconductor memory device embodying the present invention. Layers, areas, contact holes and signal lines of the memory cell array shown in FIGS. 19 and 20 are labeled with the same references designating the corresponding layers, areas, contact holes and signal lines of the first embodiment. The arrangement for the active areas 230, the word lines 102, the node contact holes 103 and the mask strips 104 is illustrated in FIG. 19, and the arrangement for the bit lines 105, the bit contact holes 106 and the plate electrode 107 is illustrated in FIG. 20. For this reason, when the feature shown in FIG. 20 is registered with the feature shown in FIG. 1 9, the composite figure illustrates the layout of the memory cell array.

The memory cell shown in FIG. 19 is similar to that of the first embodiment except for the planar configuration of the active area 230 and conductive pad layers 231. The active area 230 is shaped into a rectangular planar configuration, and has long edges parallel to the bit lines 105 and short edges parallel to the word lines 102. The rectangular planar configuration is desirable for an electron beam lithography, because the rectangle is the basic configuration for the electron beam lithography. If the electron beam lithography is expected to form the active area 101, the active area 101 is divided into small rectangular units, and the electron beam sequentially draws the small rectangular units. For this reason, the oblique line is microscopically zig-zagged, and the electron beam lithography consumes long time period. In fact, the electron beam lithography for the active area 101 consumes long time period ten times longer than the time period for the active area 230.

Figure 21:
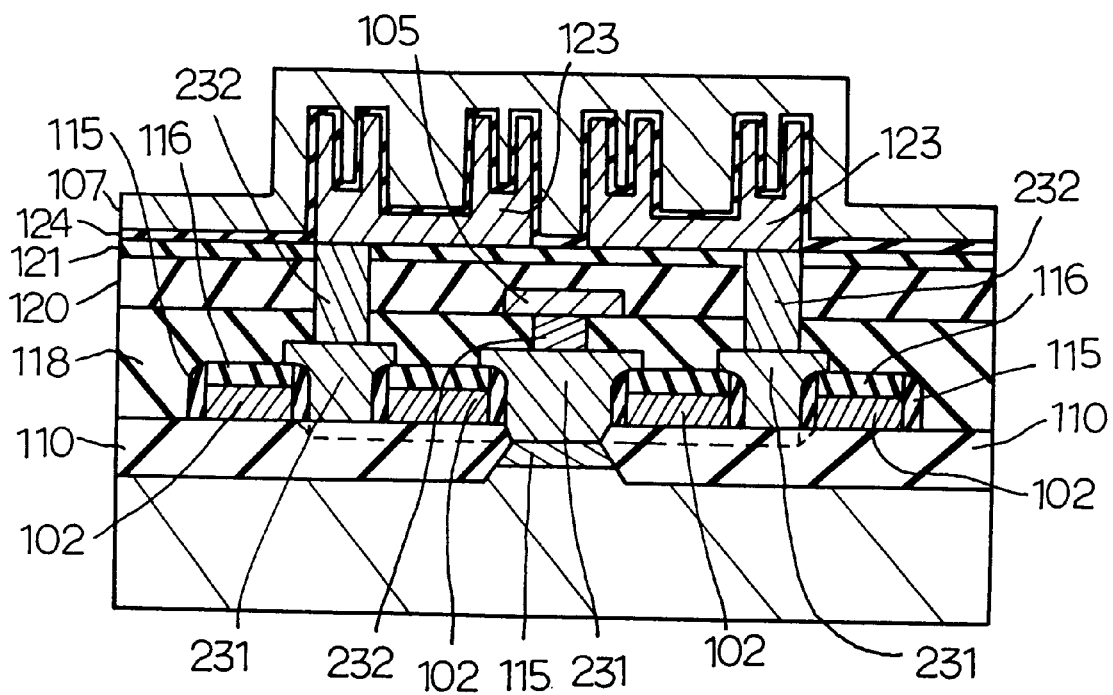
FIG. 21 is a cross sectional view taken along line A–A' of FIGS. 19 and 20 and showing the structure of a pair of memory cells incorporated in the semiconductor memory device.

The conductive pad layers 231 are inserted between the rectangular active area 230 and polysilicon plugs 232 as will be better seen in FIG. 21. Other layers, regions and signal lines are labeled with the same references designating corresponding layers, regions and signal lines of the first embodiment. The conductive pad layers 231 allow the node contact holes 103 to be offset from the contact regions of the rectangular active area 230, and the multiple cylindrical storage electrodes 123 are appropriately arranged over the stopper layer 121. The conductive pad layers 231 prevent not only the bit lines 105 but also multiple cylindrical storage electrodes 123 from undesirable short-circuit to the word lines 102.

In this instance, the node contact portions and the bit line contact portions are exposed by using the etch-back, and the process for the fourth embodiment does not contain the lithographic stage for the exposure of the node contact portions required for the third embodiment. Thus, the process for the fourth embodiment is simpler than that of the third embodiment.

Fifth Embodiment

Figure 22:
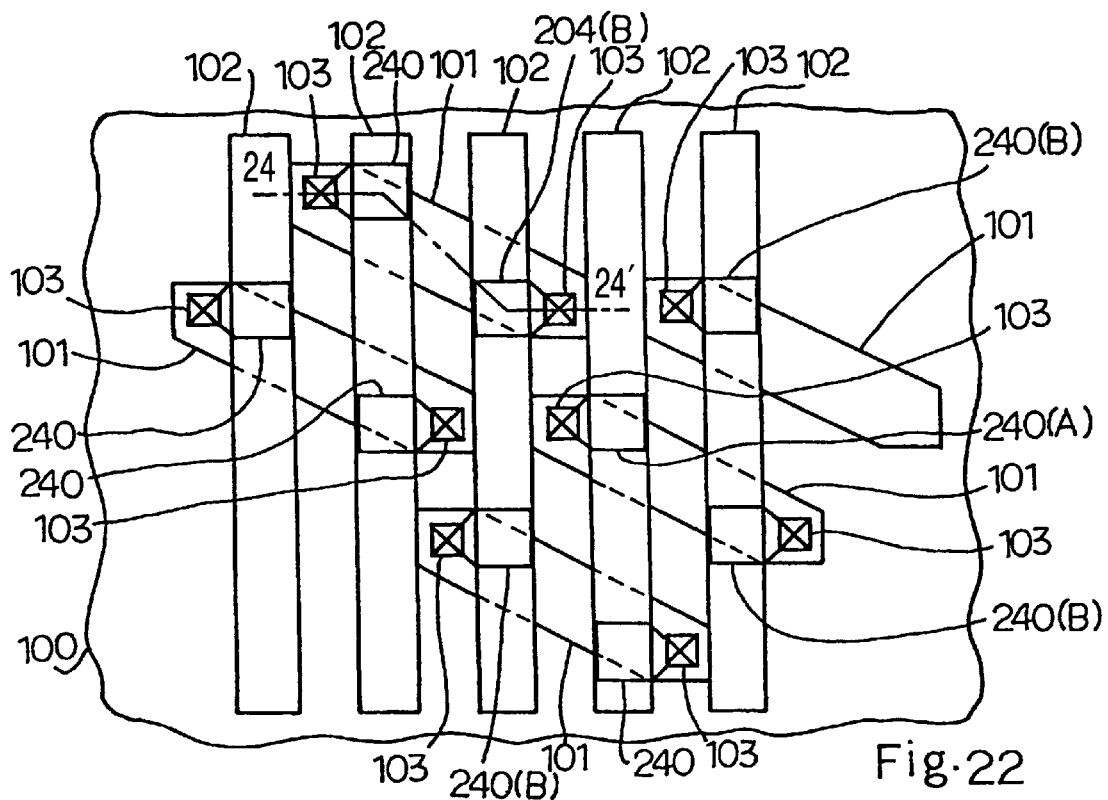
FIG. 22 is a plan view showing a layout of word lines, active areas, node contact holes and mask strips incorporated in yet another semiconductor memory device according to the present invention.
Figure 23:
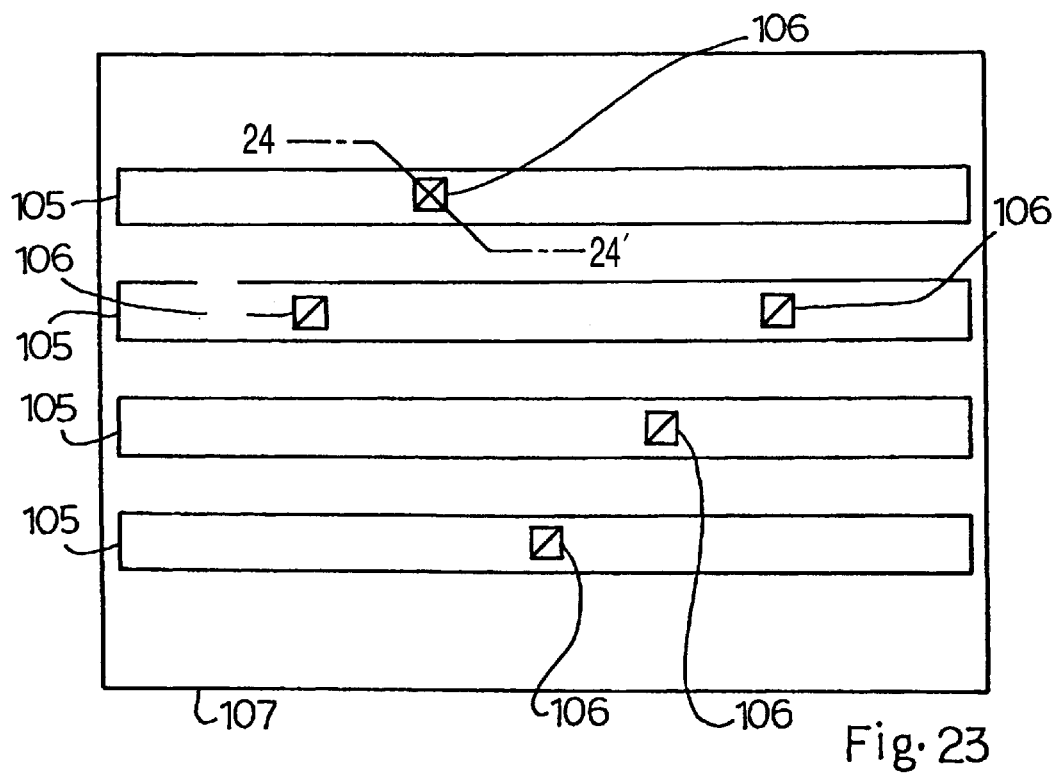
FIG. 23 is a plan view showing a layout of bit lines, bit contact holes and a plate electrode incorporated in the semiconductor memory device.

FIGS. 22 and 23 illustrate a layout of a memory cell array incorporated in yet another semiconductor memory device embodying the present invention. Layers, areas, contact holes and signal lines of the memory cell array shown in FIGS. 22 and 23 are labeled with the same references designating the corresponding layers, areas, contact holes and signal lines of the first embodiment. The arrangement for the active areas 101, the word lines 102, the node contact holes 103 and the mask strips 240 is illustrated in FIG. 22, and the arrangement for the bit lines 105, the bit contact holes 106 and the plate electrode 107 is illustrated in FIG. 23. For this reason, when the feature shown in FIG. 23 is registered with the feature shown in FIG. 22, the composite figure illustrates the layout of the memory cell array.

Figure 5A:
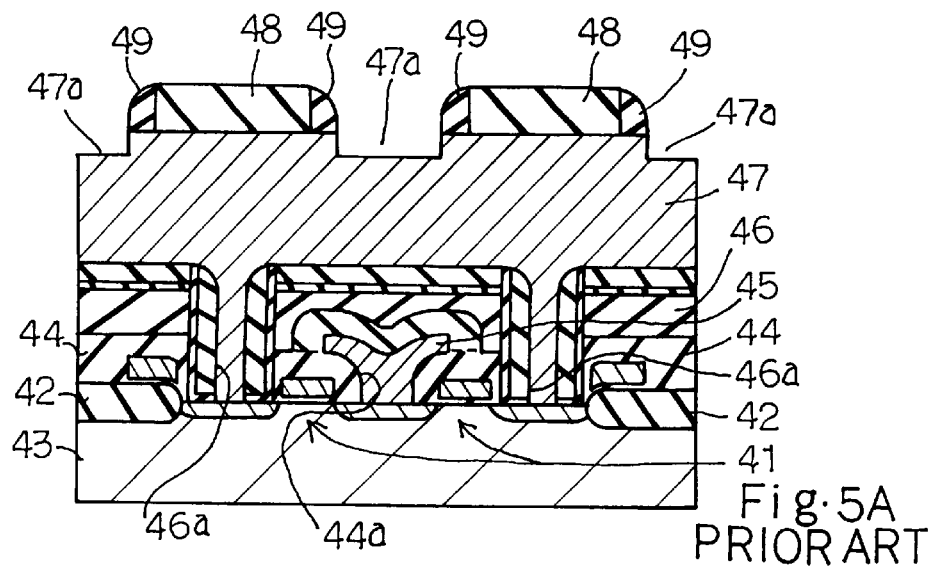
FIGS. 5A to 5C are cross sectional views showing the prior art process for fabricating the third capacitor over bit-line cell with the double cylindrical storage electrode.
Figure 5B:
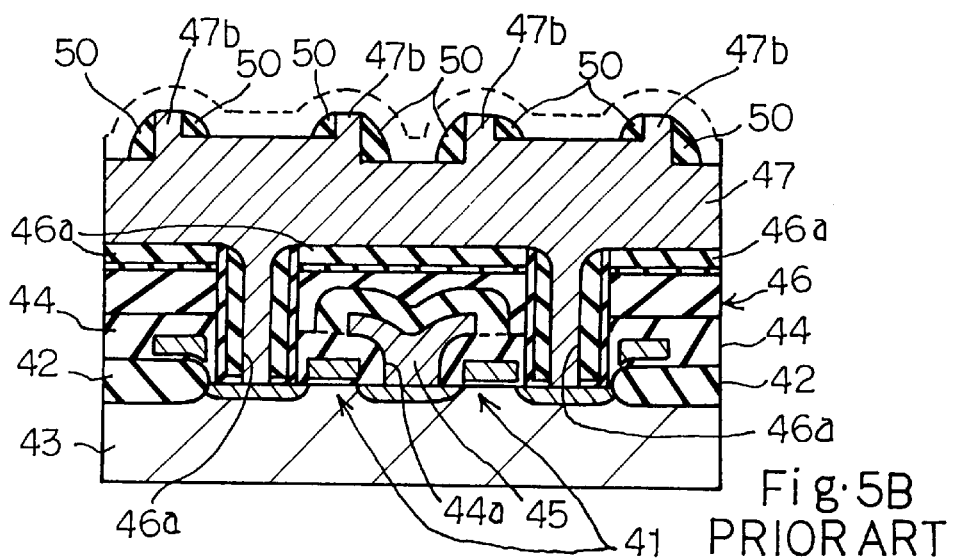
Figure 5C:
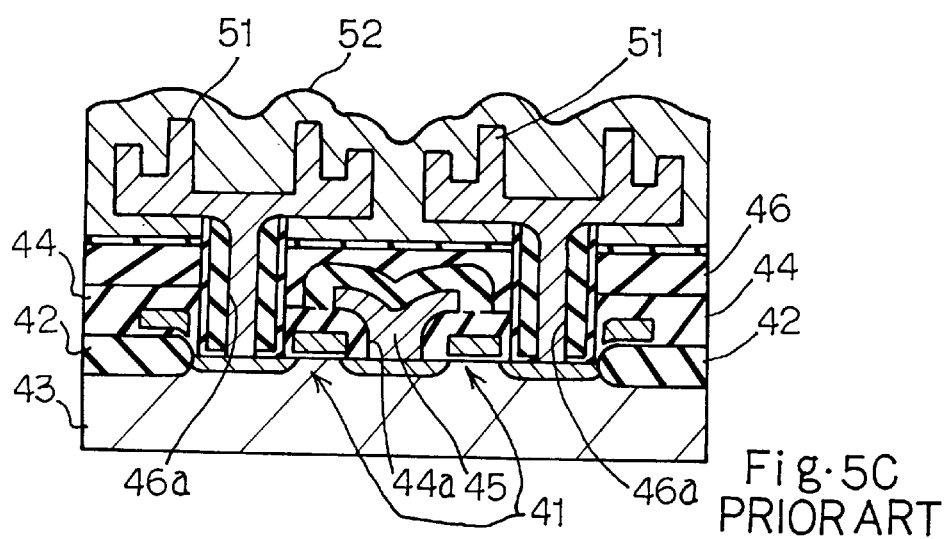
Figure 6:
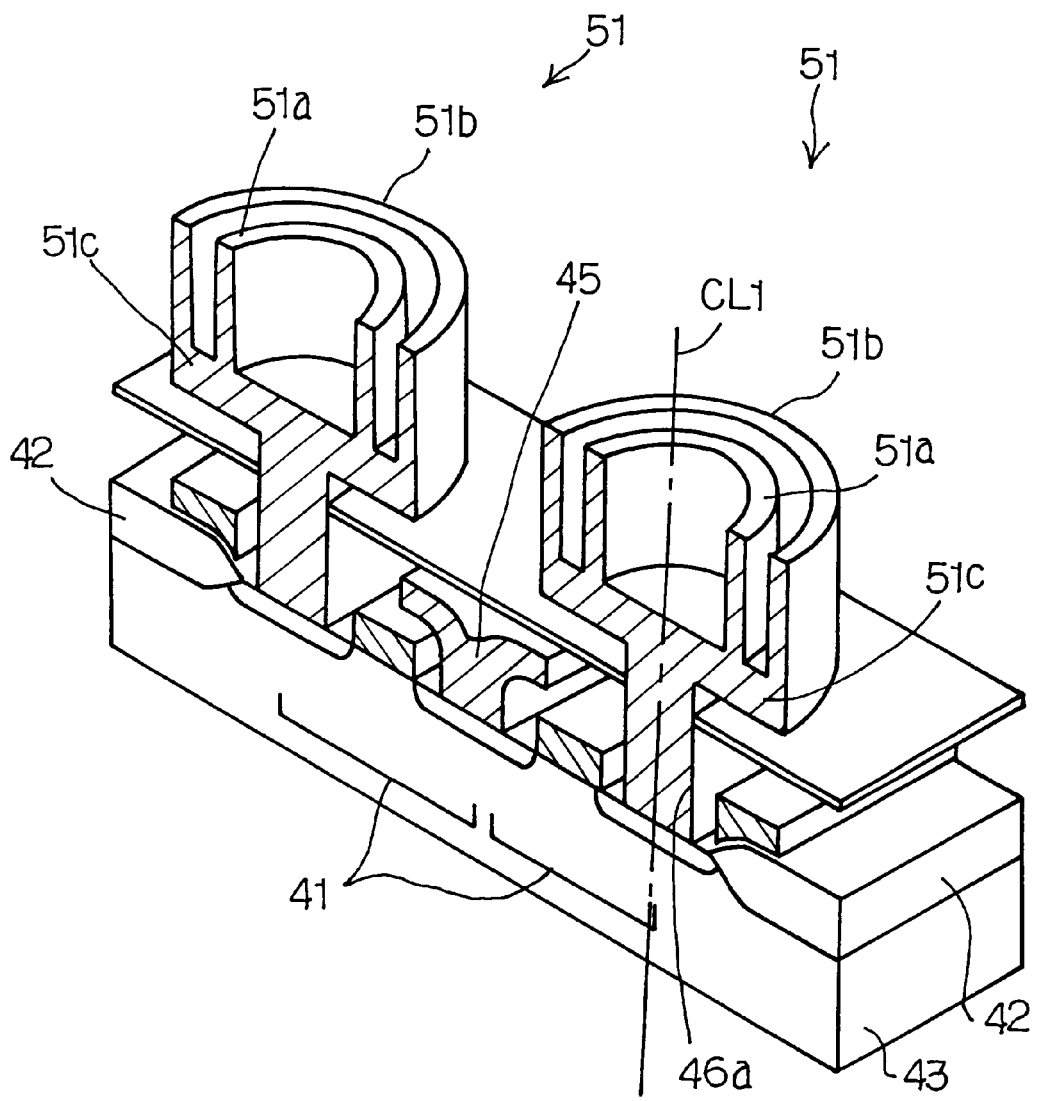
FIG. 6 is a perspective view showing the double cylindrical storage electrode of the third capacitor over bit-line cell.
Figure 24:
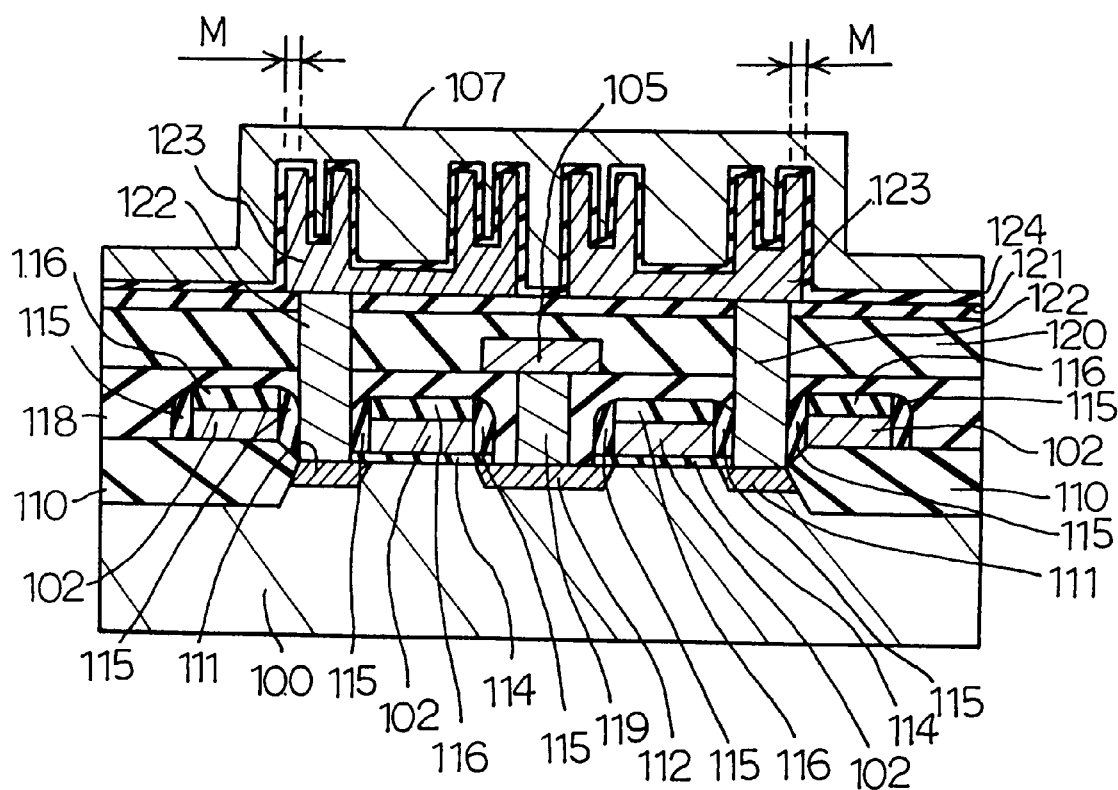
FIG. 24 is a cross sectional view taken along line A–A' of FIGS. 22 and 23 and showing the structure of a pair of memory cells incorporated in the semiconductor memory device.

The memory cell shown in FIGS. 22 and 23 is similar to that of the first embodiment except for the location of the mask strips 240. The mask strips 104/204 of the first to fourth embodiments are spaced from the node contact holes 103 without overlap. On the other hand, the mask strips 240 are partially overlapped with the associated node contact holes 103, respectively. However, the node contact holes 103 are never perfectly overlapped with the mask strips 240. This is the important difference from the third prior art capacitor over bit-line cell shown in FIGS. 5C and 6. The difference makes each mask strips 240 equally spaced from four adjacent mask strips 240. For example, the mask strip 240(A) is equally spaced from the adjacent four mask strips 240(B) (see FIG. 22). The partially overlapped arrangement increases the margin M (see FIG. 24) between a photo-mask for the storage electrodes 123 and a mask for the polysilicon plugs 122.

In the above described embodiments, the mask strips 104/204/240 are shaped into a rectangle or a pentagon. However, the planar configuration of the mask strips is never limited to the rectangle and the pentagon in so far as the mask strips are uniformly arranged or each mask strip is equally spaced from the adjacent four mask strips. The planar configuration of the storage electrode becomes similar to the mask strip 104/204/240, and a regular polygonal planar configuration or a circular planar configuration maximizes the density of the storage electrodes.

Sixth Embodiment

Figure 25:
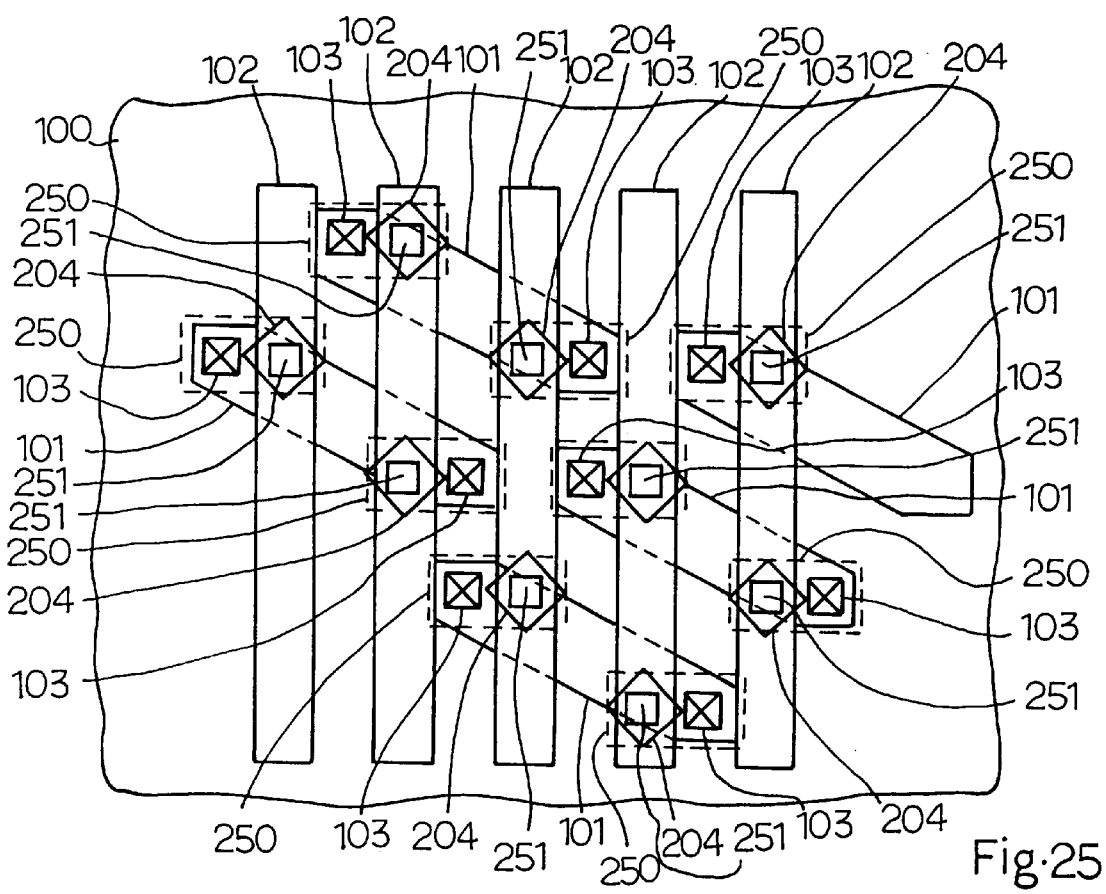
FIG. 25 is a plan view showing a layout of word lines, active areas, node contact holes and mask strips incorporated in still another semiconductor memory device according to the present invention.
Figure 26:
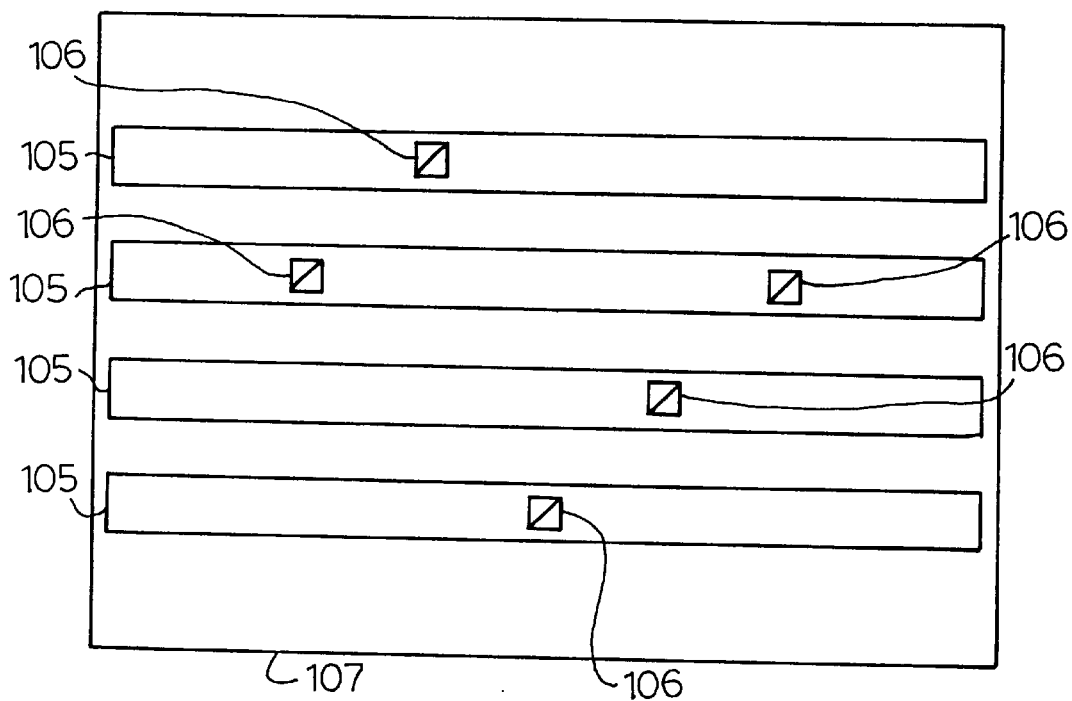
FIG. 26 is a plan view showing a layout of bit lines, bit contact holes and a plate electrode incorporated in the semiconductor memory device.

FIGS. 25 and 26 illustrate a layout of a memory cell array incorporated in still another semiconductor memory device embodying the present invention. Layers, areas, contact holes and signal lines of the memory cell array shown in FIGS. 25 and 26 are labeled with the same references designating the corresponding layers, areas, contact holes and signal lines of the second embodiment. The arrangement for the active areas 101, the word lines 102, the node contact holes 103 and the mask strips 204 is illustrated in FIG. 25, and the arrangement for the bit lines 105, the bit contact holes 1 06 and the plate electrode 107 is illustrated in FIG. 26. For this reason, when the feature shown in FIG. 26 is registered with the feature shown in FIG. 25, the composite figure illustrates the layout of the memory cell array.

The memory cell shown in FIGS. 25 and 26 is a compromise between the second embodiment and the third embodiment, and conductive pad layers 250 is inserted between the source regions of the active areas 101 and polysilicon plugs 251. The conductive pad layer 250 has a contact portion laterally projecting from a boss portion held in contact with the source region, and allows the polysilicon plug 251 to be offset from the source region. In this instance, the contact portion is located over the word line 102, and, accordingly, the mask strip 204 is patterned over the word line 102. The conductive pad layer 250 causes the polysilicon plug 251 to connect it to the storage electrode over the word line 102, and makes the node contact hole 103 shallow. For this reason, a process sequence for the sixth embodiment enhances the production yield of the semiconductor memory device.

Seventh Embodiment

Figure 27:
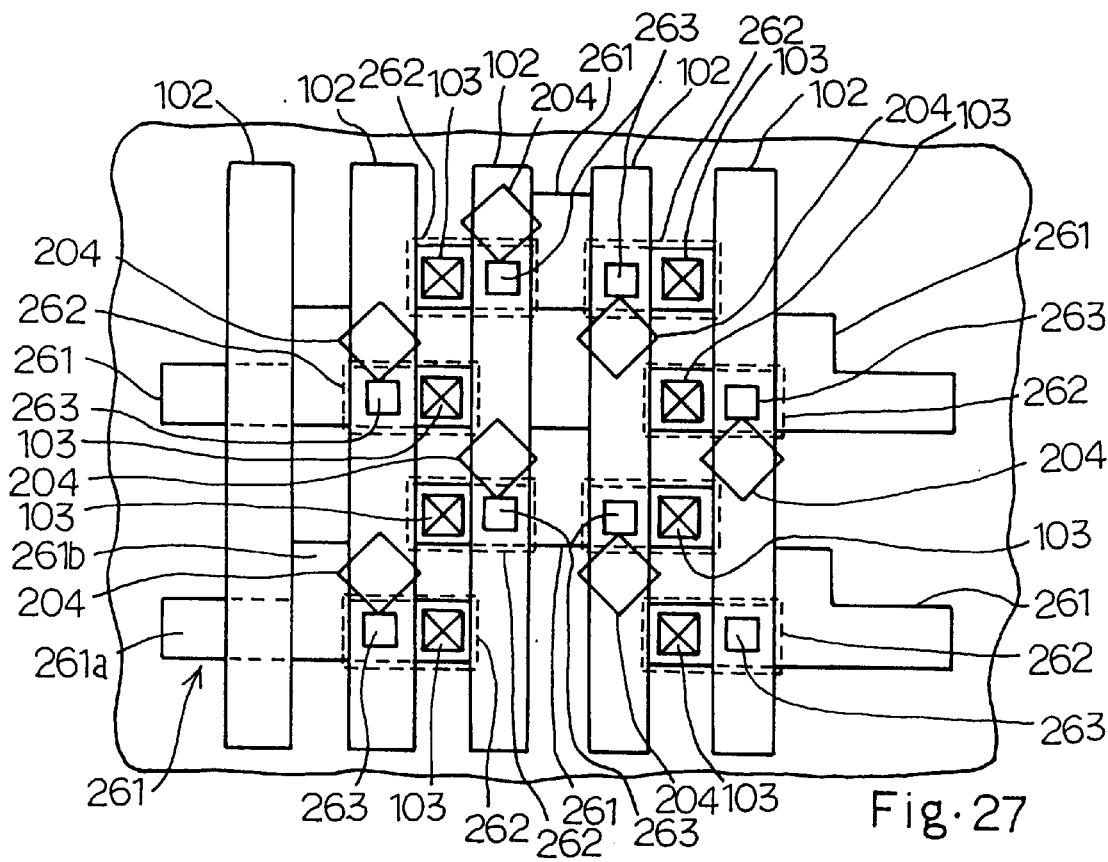
FIG. 27 is a plan view showing a layout of word lines, active areas, node contact holes and mask strips incorporated in yet another semiconductor memory device according to the present invention.
Figure 28:
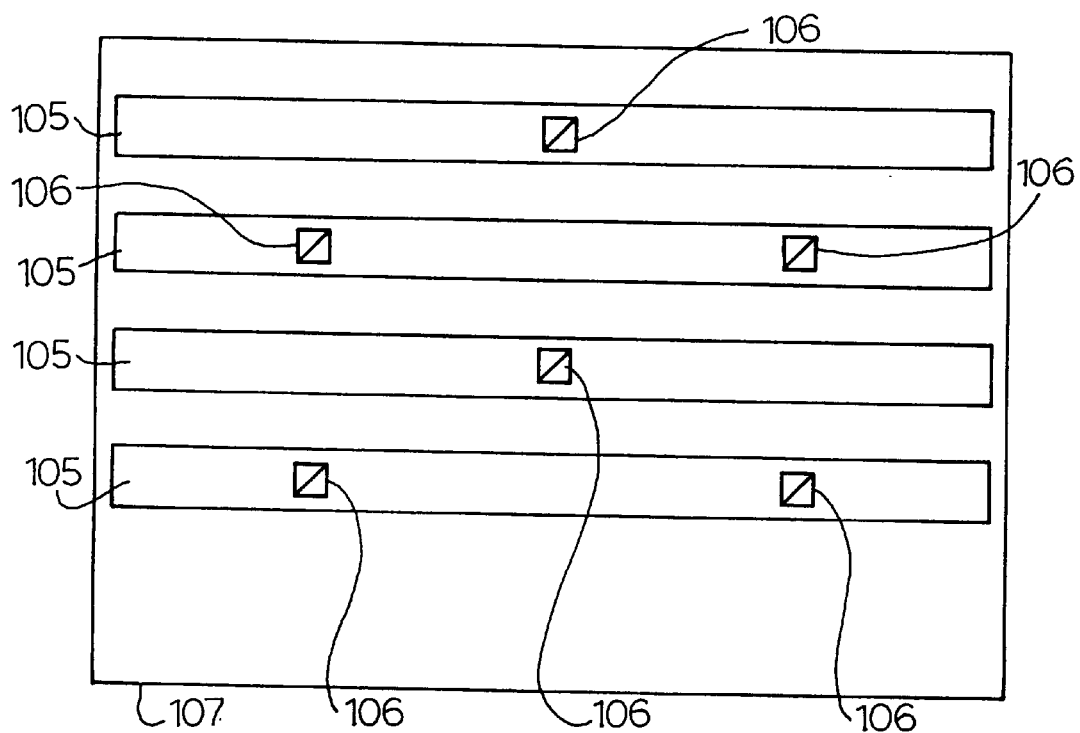
FIG. 28 is a plan view showing a layout of bit lines, bit contact holes and a plate electrode incorporated in the semiconductor memory device.

FIGS. 27 and 28 illustrate a layout of a memory cell array incorporated in yet another semiconductor memory device embodying the present invention. The arrangement for active areas 261, the word lines 102, the node contact holes 103, conductive pad layers 262, polysilicon plugs 263 and the mask strips 204 is illustrated in FIG. 27, and the arrangement for the bit lines 105, the bit contact holes 106 and the plate electrode 107 is illustrated in FIG. 28. For this reason, when the feature shown in FIG. 28 is registered with the feature shown in FIG. 27, the composite figure illustrates the layout of the memory cell array.

The memory cell shown in FIGS. 27 and 28 is different from the other embodiments as follows. First, the active area 261 has a source contact regions in a rectangular sub-area 261*a* and a drain contact region 26*b* projecting from the rectangular sub-area 261*a*, and no oblique line defines the active area 261. Thus, the active area 261 has the planar configuration appropriate for the electron beam lithography. Second, the word lines 102 are arranged at pitch twice as wide as the pitch of the fourth embodiment between adjacent two bit contact holes 105 on each bit line 106. For this reason, the influence between the bit line contacts 105 or leakage charge is less than that of the fourth embodiment.

Eighth Embodiment

Figure 29:
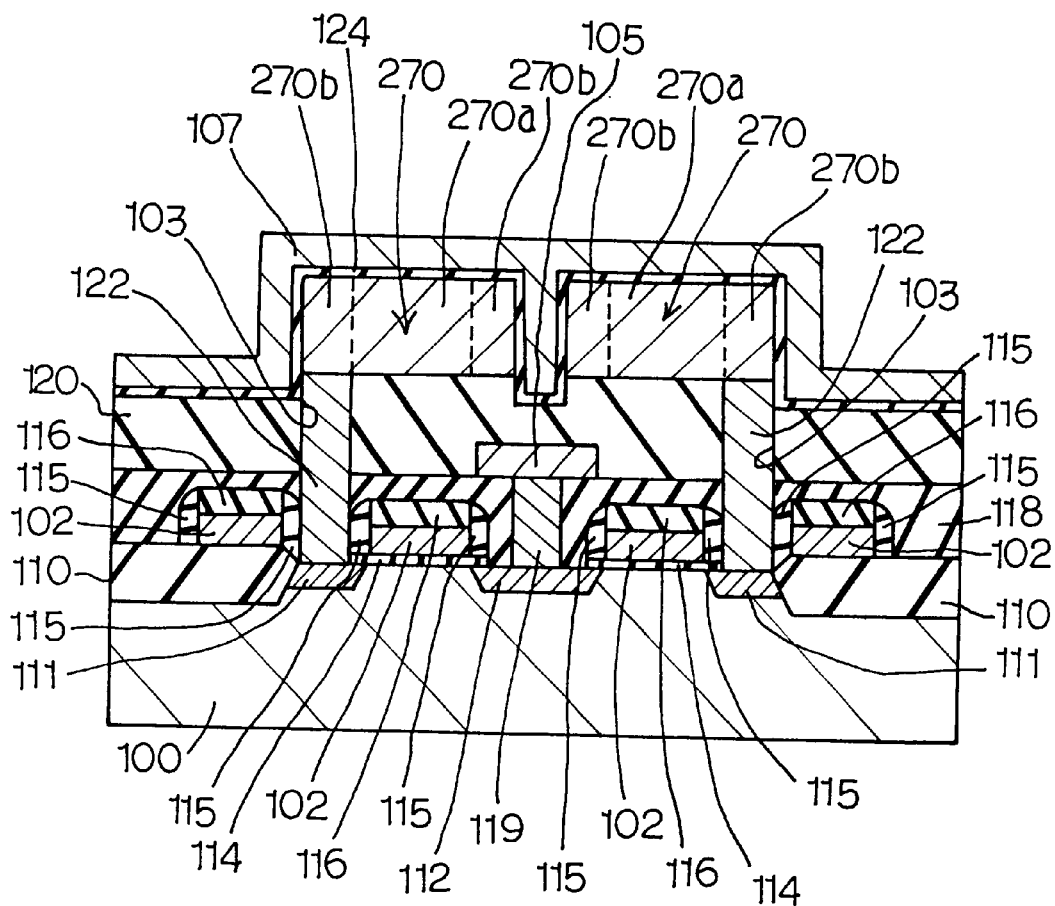
FIG. 29 is a cross sectional view showing the structure of still another semiconductor memory device according to the present invention.

FIG. 29 illustrates the structure of still another semiconductor memory device embodying the present invention. Although the layout of the memory cell array is not shown in the drawings, it is analogous to that of the first embodiment. The structure of the semiconductor memory device is similar to that of the first embodiment except for the configuration of storage electrodes 270. For this reason, the other layers, regions, signal lines and contact holes are labeled with the same references designating corresponding layers, regions, signal lines and contact holes of the first embodiment.

The storage electrode 270 has a column-shaped core portion 270*a* and a cylindrical peripheral portion 270*b*. The column-shaped core portion 270*a* is snugly received into the cylindrical peripheral portion 270*b*. The cylindrical peripheral portion 270*b* is formed by using a mask strip forming a part of the core pattern. The peripheral portion 270*b* is not limited to a cylindrical configuration in so far as the peripheral portion 270*b* is electrically connected to the source region 111. The composite dielectric film structure 124 is implemented by the silicon oxide film and the silicon nitride film, and is conformable to the storage electrode 270 regardless of the configuration of the storage electrode. The cylindrical configuration provides wide surface, and is desirable. Certain dielectric material has the dielectric constant larger than the silicon oxide and the silicon nitride, and forms a layer equivalent to a silicon dioxide layer of 0.5 nanometer to 1.5 nanometers thick. However, a dielectric layer of the certain dielectric material is less conformable to the storage electrode, and a simple column-shaped core portion is desirable for the dielectric layer.

FIGS. 30A to 30G illustrate a process for fabricating the storage electrode 270. The lower sub-structure under the bit line 105 is omitted from FIGS. 30A to 30G, because the lower sub-structure is fabricated as similar to the first embodiment.

Figure 30A:
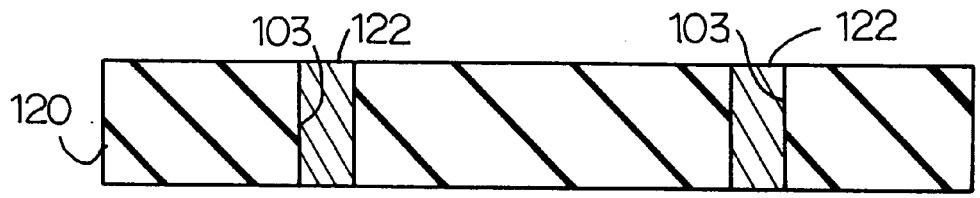
FIGS. 30A to 30G are cross sectional views showing a process for fabricating the semiconductor memory device shown in FIG. 29.

The bit line 105 is covered with the second inter-level insulating layer 120 of silicon dioxide, and the node contact holes 103 are formed by using the lithographic techniques and the etching. The source regions 111 are exposed to the node contact holes 103. The node contact holes 103 are plugged with doped polysilicon pieces 122 as shown in FIG. 30A, and the doped polysilicon plugs 122 are held in contact with the source regions 111.

Figure 30B:
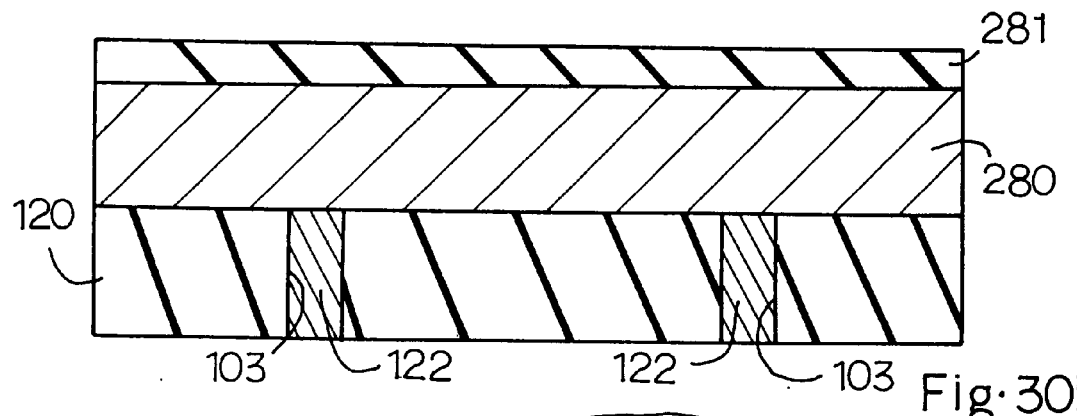

Tungsten is deposited over the second inter-level insulating layer 120 by using a chemical vapor deposition or a sputtering, and forms a tungsten layer 280. Silicon dioxide is deposited over the tungsten layer 280 by using the chemical vapor deposition, and forms a silicon dioxide layer 281 as shown in FIG. 30B.

Figure 30C:
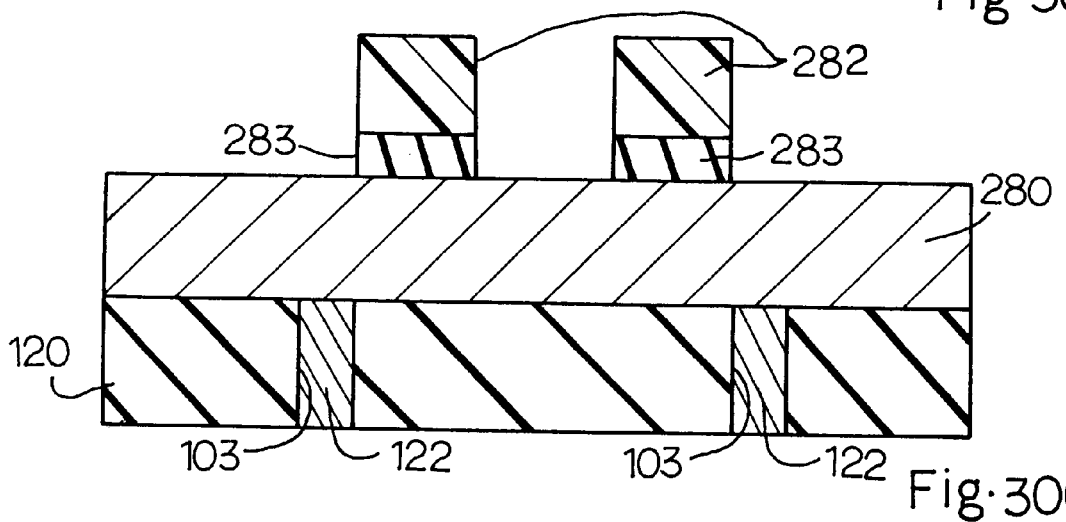

A photo-resist etching mask 282 is formed on the silicon dioxide layer 281 by using the lithographic techniques, and has the minimum dimensions as similar to the photo-resist etching mask for the core pattern 104. Using the photo-resist etching mask 282, the silicon dioxide layer 281 is selectively etched away, and the mask pattern is transferred from the photo-resist etching mask 282 to the mask strips 283 as shown in FIG. 30C. The photo-resist etching mask 282 is stripped off.

Figure 30D:
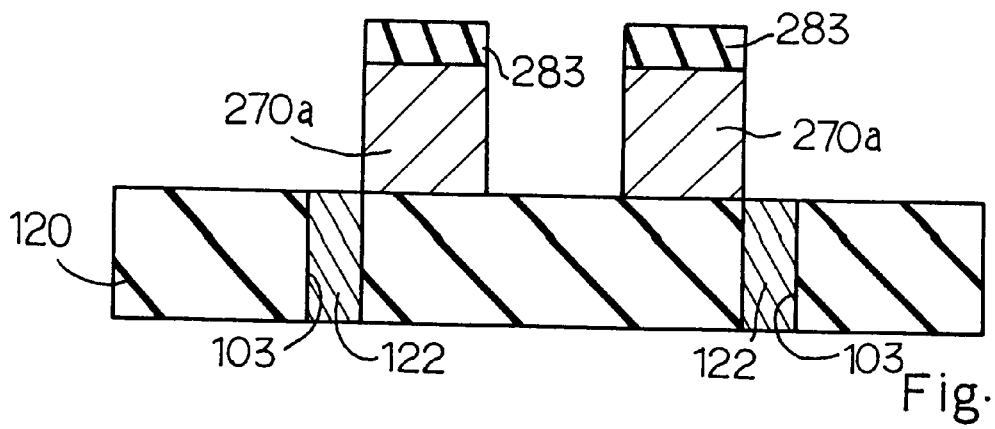
Figure 30E:
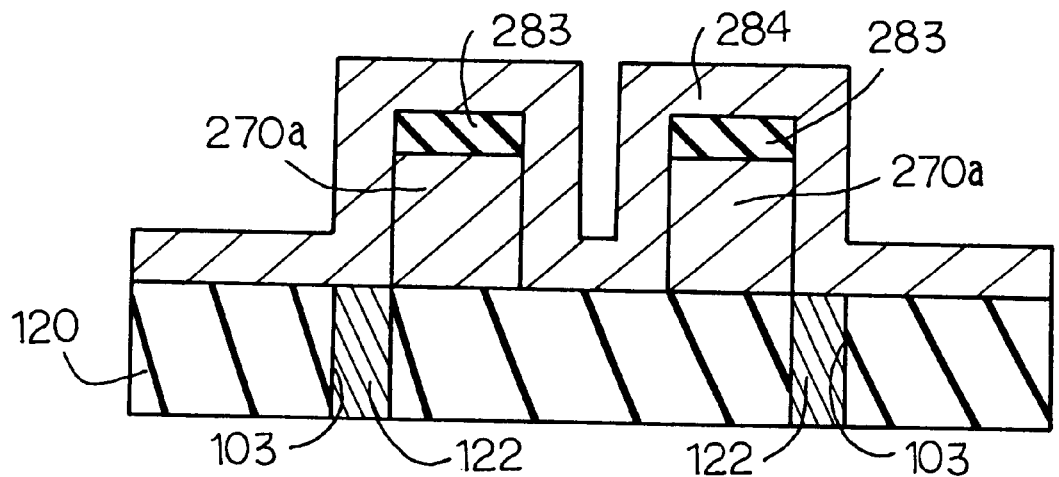

Using the mask strips 283 or the core pattern as an etching mask, the tungsten layer 280 is patterned into the column-shaped core portions 270a by using a dry etching technique as shown in FIG. 30D.

Subsequently, tungsten is deposited over the entire surface of the resultant semiconductor structure by using the chemical vapor deposition, and forms a tungsten layer 284. The tungsten layer 284 is conformable to the semiconductor structure shown in FIG. 30E.

Figure 30F:
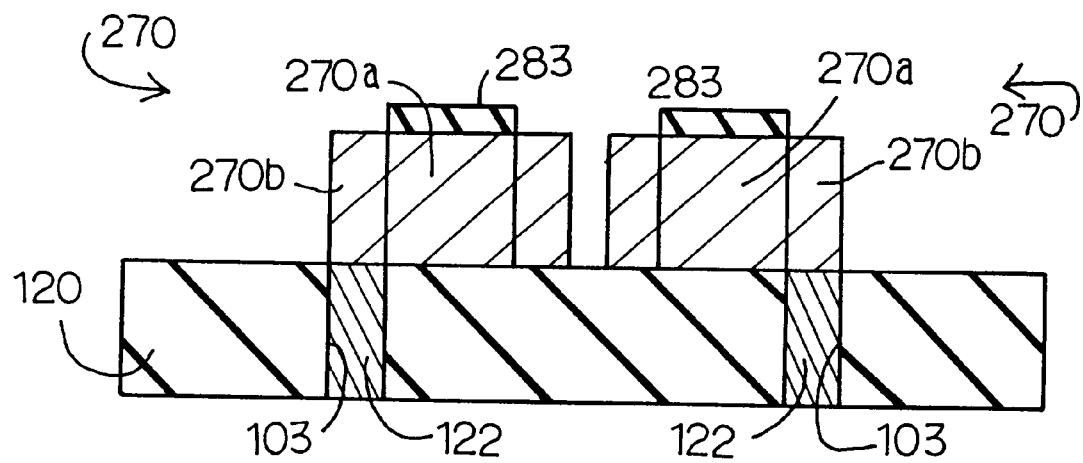

The tungsten layer 284 is etched back without an etching mask until the mask strips 283 is exposed again. As a result, the cylindrical peripheral portions 270b are formed around the column-shaped core portions 270a as shown in FIG. 30F. The column-shaped core portion 270a and the cylindrical peripheral portion 270b form in combination the storage electrode 270.

Figure 30G:
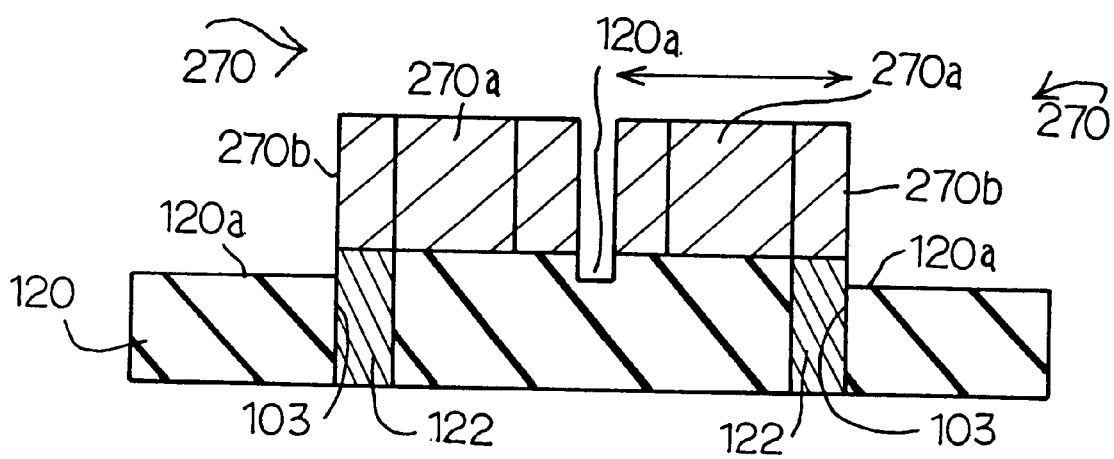

Subsequently, the mask strips 283 are removed by using the etch-back technique as shown in FIG. 30G. While the mask strips 283 are being etched, the etchant forms grooves 120a in the second inter-level insulating layer 120 between the storage electrodes 270. The grooves 120a do not have any influence on the data storage characteristics of the memory cell.

Dielectric material with large dielectric constant is deposited over the entire surface of the storage electrodes 270, and is, by way of example, $Ta_2O_5$, $Ba_xSr_{1-x}TiO_3$ or $SrBi_2Ta_2O_9$. The dielectric film may be used for a storage capacitor incorporated in 4 giga-bit semiconductor dynamic random access memory device.

Ninth Embodiment

Figure 31:
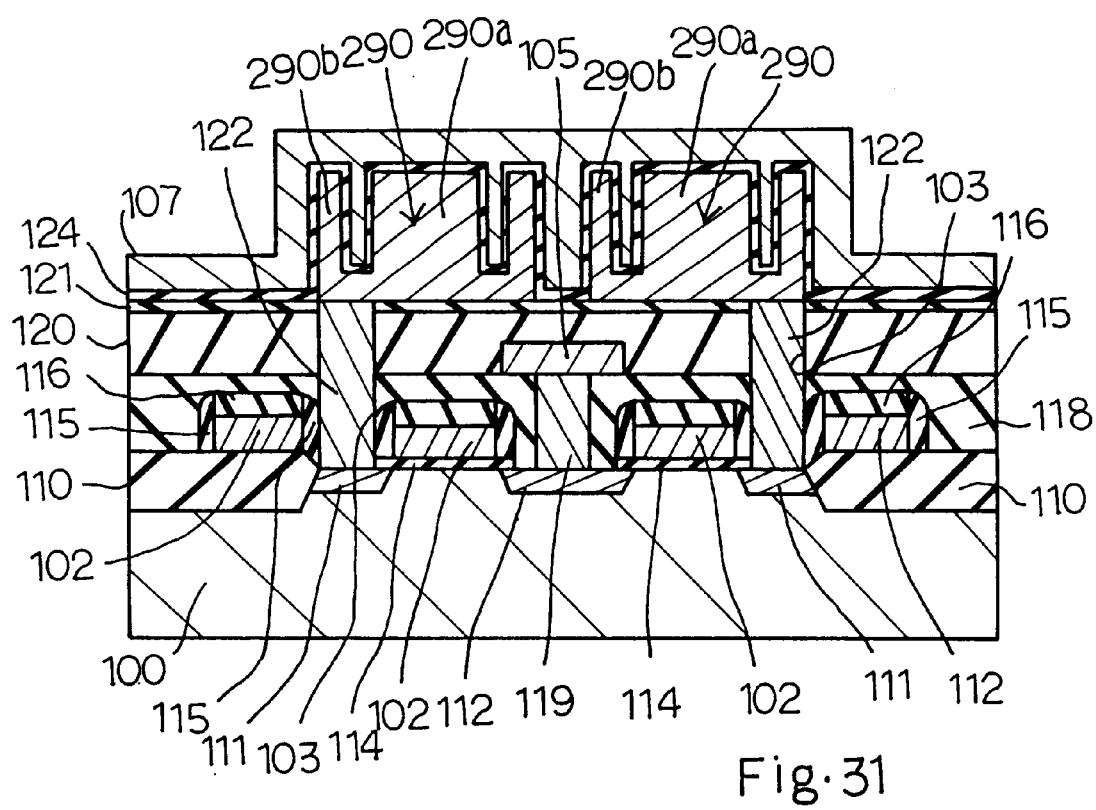
FIG. 31 is a cross sectional view showing the structure of yet another semiconductor memory device according to the present invention.

FIG. 31 illustrates the structure of yet another semiconductor memory device embodying the present invention. Although the layout of the memory cell array is not shown in the drawings, it is, by way of example, analogous to that of the first embodiment. The structure of the semiconductor memory device is similar to that of the first embodiment except for the configuration of storage electrodes 290. For this reason, the other layers, regions, signal lines and contact holes are labeled with the same references designating corresponding layers, regions, signal lines and contact holes of the first embodiment.

Figure 12:
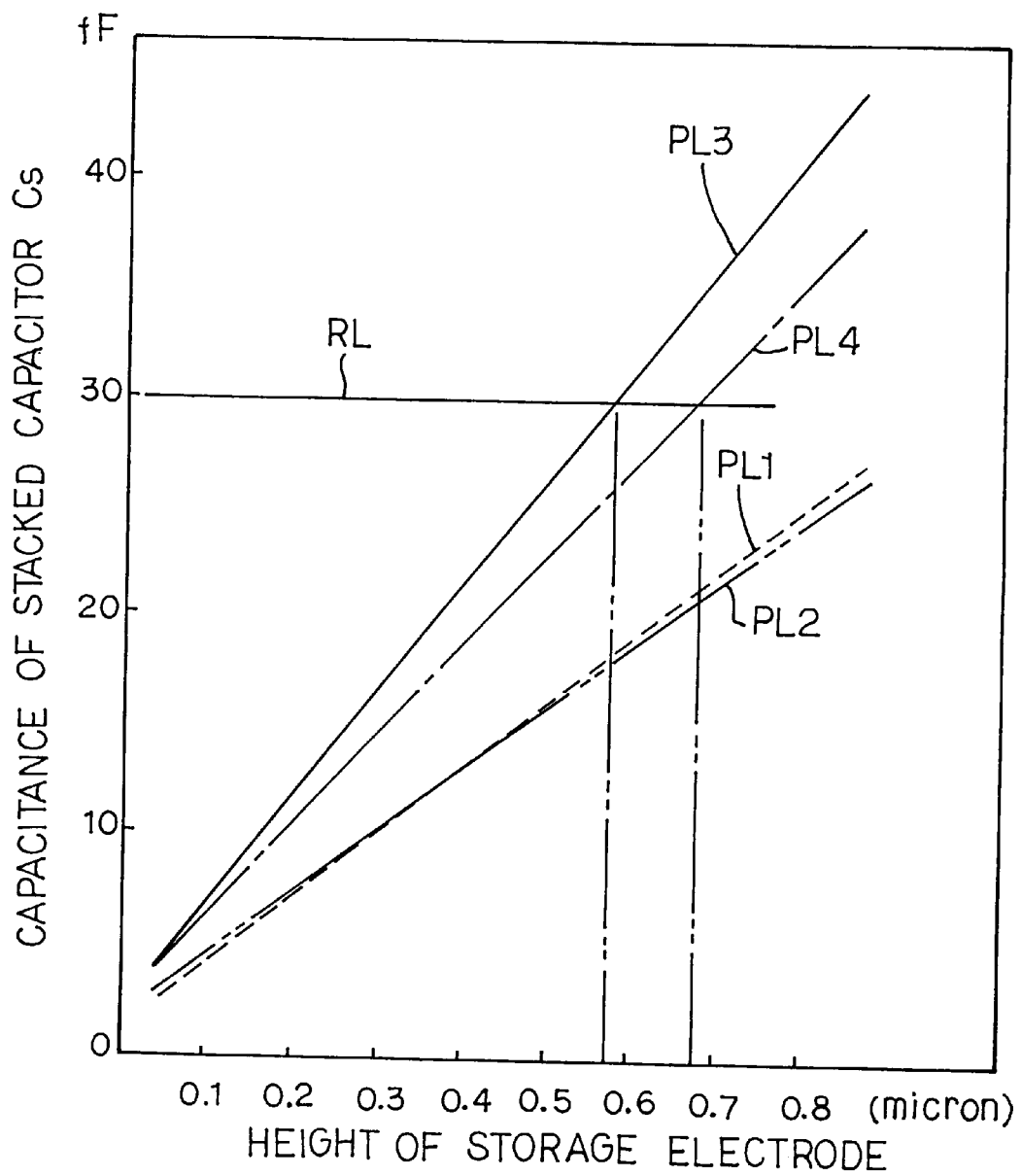
FIG. 12 is a graph showing the relation between the height of an storage electrodes and the capacitance of storage capacitors incorporated in the first prior art capacitor over bit-line cell, the second prior art capacitor over bit-line pair and a memory cell incorporated in the semiconductor dynamic random access memory device according to the present invention.

The storage electrode 290 has a column-shaped core portion 290a and a cylindrical peripheral portion 290b. The cylindrical peripheral portion 290b has an inner diameter larger than a diameter of the column-shaped core portion 290a, and a gap takes place between the column-shaped core portion 290a and the cylindrical peripheral portion 290b. The storage capacitor with the storage electrode 290 increases the capacitance together with the height as indicated by plots PL4 (see FIG. 12). Although the increment of capacitance is smaller than the increment of the double cylindrical storage electrode, the storage capacitor exceeds 30 fF before reaching 0.7 microns high, and the storage electrode 290 is available for 1 giga-bit dynamic random access memory device.

Moreover, the column-shaped core portion 290a is larger in mechanical strength than the inner cylindrical portion. When insulating material with a large dielectric constant such as $Ta_2O_5$ is used as the dielectric film 124, the plate electrode 107 is usually formed of TiN or WN. However, TiN and WN are causative of large thermal stress. For this reason, the column-shaped core portion 290a is desirable.

Figure 32A:
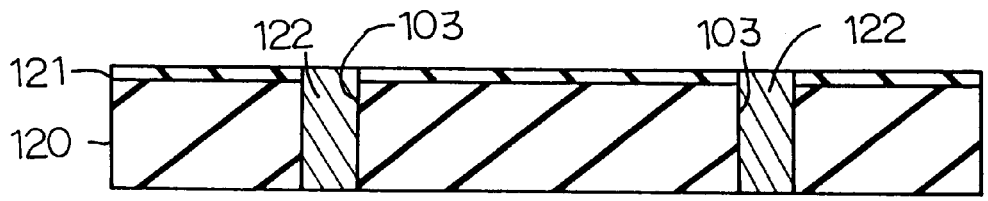
FIGS. 32A to 32H are cross sectional views showing a process for fabricating the semiconductor memory device shown in FIG. 3 according to the present invention.

The storage electrode 290 is fabricated as shown in FIGS. 32A to 32H. The lower sub-structure under the bit line 105 is also omitted from these figures. Silicon dioxide is deposited over the bit line 105, and forms the second inter-level insulating layer 120. Silicon nitride is further deposited over the second inter-level insulating layer 120, and forms the stopper layer 121. The node contact holes 103 are formed by using the lithographic techniques and the etching, and the source regions 111 are exposed to the node contact holes 103. The node contact holes 103 are filled with the polysilicon plugs 122 as shown in FIG. 32A.

Figure 32B:
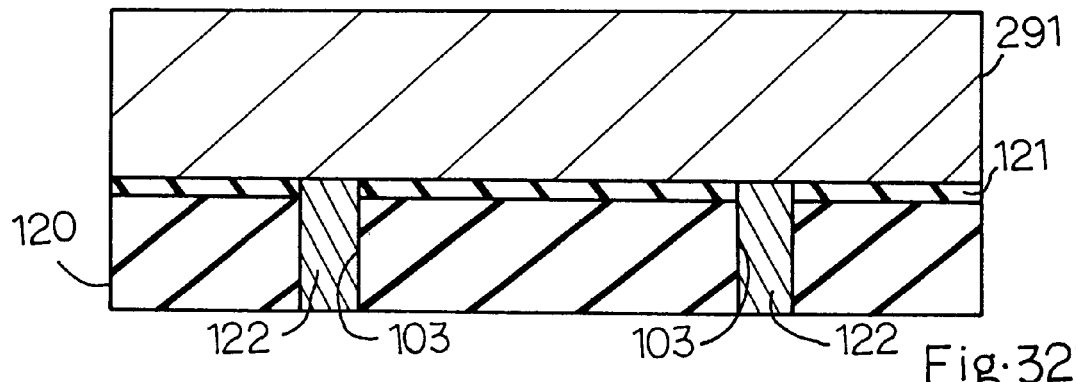
Figure 32C:
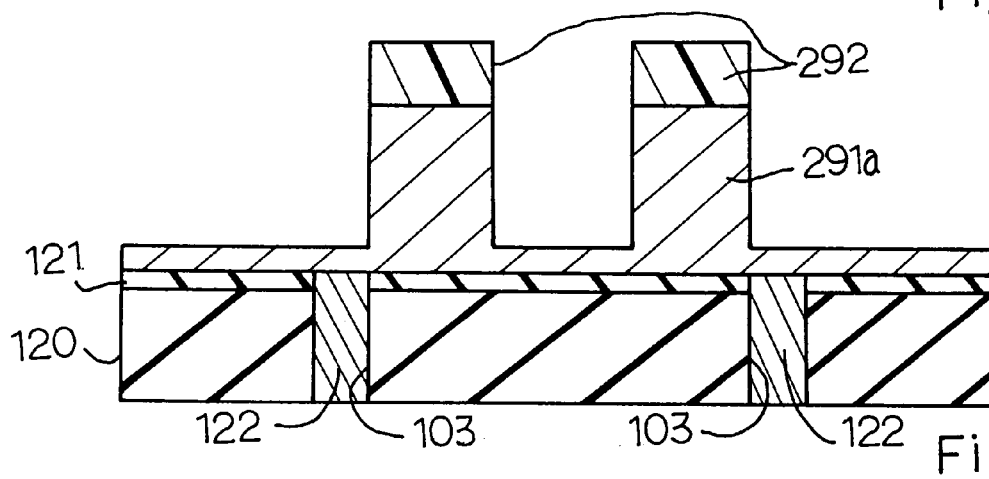

N-type doped polysilicon is deposited over the entire surface of the resultant semiconductor structure, and forms an n-type doped polysilicon layer 291 as shown in FIG. 32B. A photo-resist etching mask 292 is formed on the n-type doped polysilicon layer 291 by using the lithographic techniques, and is corresponding to the photo-resist etching mask for the mask strips 104. Using the photo-resist etching mask 292, the n-type doped polysilicon layer 291 is selectively etched by using a reactive ion etching, and the n-type doped polysilicon layer 291 is patterned into a preliminary column-shaped structure 291a as shown in FIG. 32C.

Figure 32D:
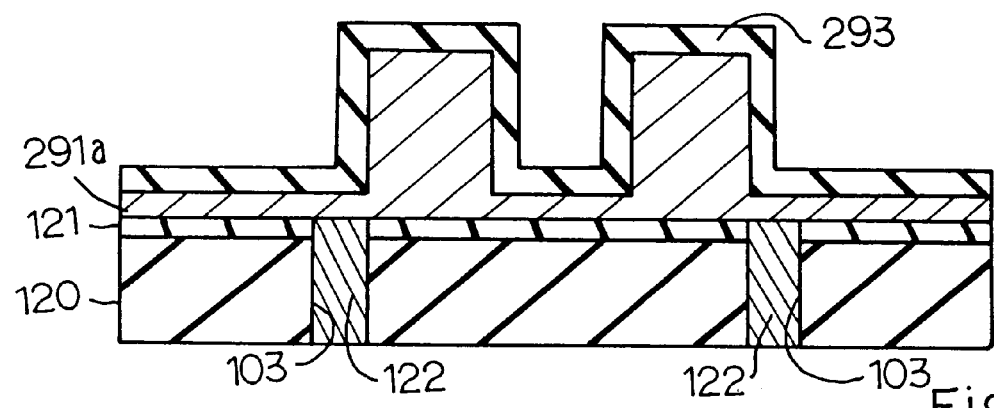

The photo-resist etching mask 292 is stripped off, and silicon dioxide is deposited over the entire surface of the resultant semiconductor structure. The silicon dioxide forms a silicon oxide layer 293, and the silicon oxide layer 293 is conformal to the preliminary column-shaped structure 291a as shown in FIG. 32D.

Figure 32E:
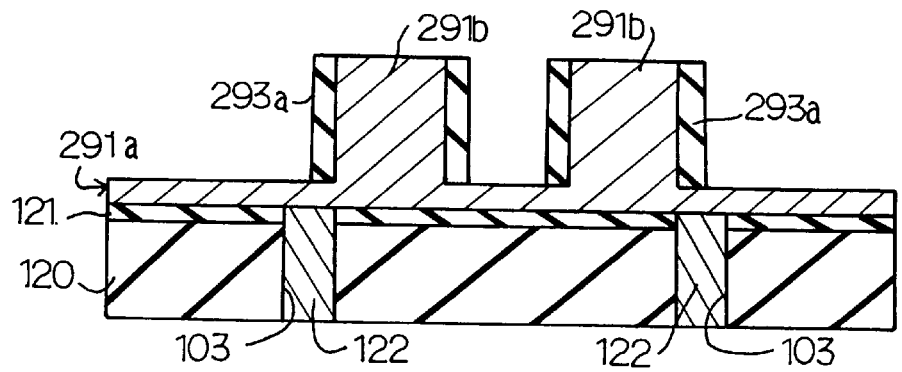
Figure 32F:
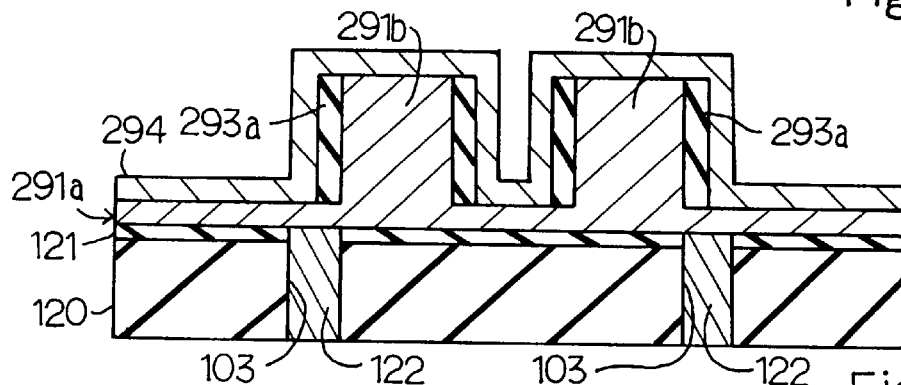

Subsequently, side wall spacers 293a are formed from the silicon oxide layer 293 by using the etch-back technique, and are formed on the side surfaces of the columns 291b of the preliminary column-shaped structure 291 as shown in FIG. 32E. N-type doped polysilicon is deposited over the entire surface of the resultant semiconductor structure, and forms an n-type doped polysilicon layer 294. The n-type doped polysilicon layer 294 is conformal to the side wall spacers 293a and the preliminary column-shaped structure 291a as shown in FIG. 32F.

Figure 32G:
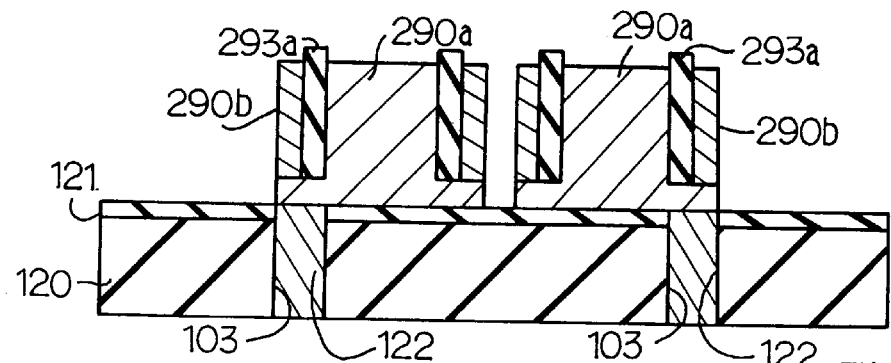
Figure 32H:
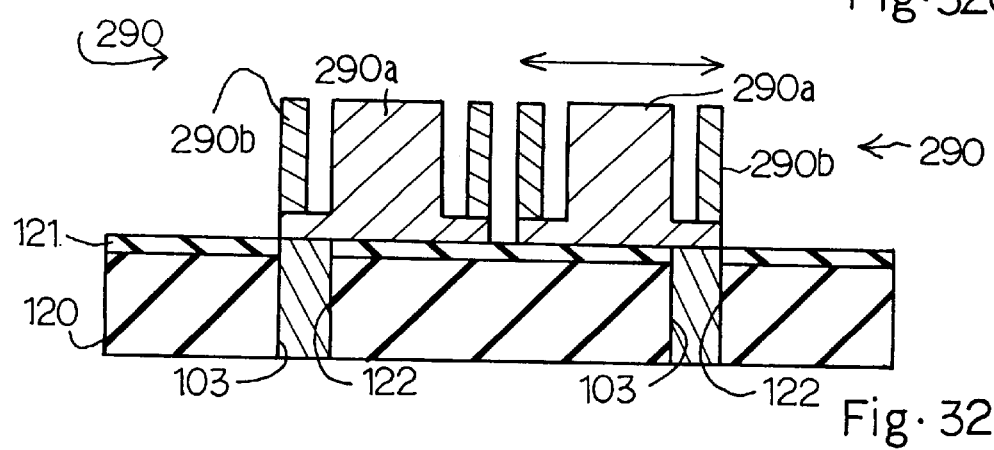

Subsequently, the n-type doped polysilicon layer 294 and the preliminary column-shaped structure 291a are uniformly etched by suing the etch-back technique until the stopper layer 121 is exposed again. Then, the column-shaped core portions 290a and the cylindrical peripheral portions 290b are left on the stopper layer 121 as shown in FIG. 32G. Finally, the side wall spacers 293a is removed in wet etchant mainly consisting of hydrofluoric acid, and the storage electrode 290 is completed as shown in FIG. 32H.

As will be appreciated from the foregoing description, the mask strips are arranged in such a manner that each mask strip is equally spaced from adjacent fourth mask strips, and the mask strips thus arranged cause the storage electrodes be arranged at high dense. When the double cylindrical portion or the column/cylindrical portion is formed, the storage electrode can provide the minimum capacitance to be expected to a 1 giga-bit semiconductor dynamic random access memory device.

Although particular embodiments of the present invention have been shown and described, it will be obvious to those skilled in the art that various changes and modifications may be made without departing from the spirit and scope of the present invention. For example, the dynamic random access memory cells according to the present invention may form a part of an ultra large scale integration.

What is claimed is:

1. A semiconductor memory device comprising
    a plurality of switching transistors each including
        a source region formed in a semiconductor substrate,
        a drain region formed in said semiconductor substrate and spaced from said source region by a channel region, and
        a gate insulating layer covering said channel region,
    a plurality of word lines selectively extending over the gate insulating layers of said plurality of switching transistors for serving as respective gate electrodes of said plurality of switching transistors,
    a plurality of bit lines extending over said plurality of switching transistors and selectively connected to the drain regions of said plurality of switching transistors,
    an inter-level insulating structure covering said plurality of bit lines and having a plurality of node contact holes open to the source regions of said plurality of switching transistors, respectively, and
    a plurality of storage capacitors provided over said inter-level insulating structure, each of said plurality of storage capacitors including
        an storage electrode electrically connected through one of said plurality of node contact holes to said source region of associated one of said plurality of switching transistors,
        a dielectric film structure covering said storage electrode, and
        a counter electrode held in contact with said dielectric film structure,
        the storage electrodes of said plurality of storage capacitors having respective centers, the center of each storage electrode being substantially equally spaced from the centers of adjacent four storage electrodes.

2. The semiconductor memory device as set forth in claim 1, in which said storage electrode has a planar configuration shaped into one of a polygon and a circle.

3. The semiconductor memory device as set forth in claim 1, in which said storage electrode has
    a base portion located over said one of said plurality of node contact holes, and
    a multiple structure projecting from an upper surface of said base portion and having a plurality of component members nested into one another.

4. The semiconductor memory device as set forth in claim 3, in which said multiple structure has an inner cylinder and an outer cylinder formed around and spaced from said inner cylinder.

5. A semiconductor memory device, comprising:
    a substrate;
    a plurality of word lines and bit lines disposed on said substrate;
    a plurality of storage elements disposed on said substrate, wherein each of said storage elements is spaced a substantially equal distance from neighboring ones of said storage elements; and
    a plurality of active areas disposed on said substrate and operatively coupled to said word lines and said bit lines, said active areas having regions that are operatively coupled to corresponding ones of said storage elements, wherein each of said regions is spaced differently from neighboring ones of said regions than said storage elements.

6. A semiconductor memory device, according to claim 5, wherein each of said active areas includes a pair of field effect transistors having a common drain region operatively coupled to one of said bit lines, a pair of source regions, each being operatively coupled to one of said storage elements, and a pair of gates, each being operatively coupled to one of said word lines.

7. A semiconductor memory device, according to claim 5, wherein each of said storage elements is a storage electrode having a base portion and at least one other portion extending therefrom.

8. A semiconductor memory device, according to claim 7, wherein said other portion includes multiple cylindrical portions having an outer cylindrical portion and having an inner cylindrical portion disposed within said outer cylindrical portion.

9. A semiconductor memory device, according to claim 8, further comprising:
    an opposing electrode disposed between said inner and outer cylindrical portions and disposed about an outside surface of said outer cylindrical portion; and
    a dielectric film between said opposing electrode and said cylindrical portions.

10. A semiconductor memory device, according to claim 9, wherein said opposing electrode is also disposed opposite to an inner cylindrical portion of said inner electrode and said dielectric film is disposed between said opposing electrode and said inner cylindrical portion of said inner electrode.

11. A semiconductor memory device, according to claim 5, further comprising:
    a plurality of node contact holes corresponding to said regions, each of said node contact holes containing a conductive plug connected to a base portion of said storage element.

12. A semiconductor memory device, according to claim 5, wherein said word lines are perpendicular to said bit lines.

13. A semiconductor device, according to claim 12, wherein said active areas are oblique to said word lines and said bit lines.

14. A semiconductor memory device, according to claim 12, wherein central portions of said storage elements are formed from a plurality of mask strips.

15. A semiconductor memory device, comprising:
    a substrate;
    a plurality of active areas disposed on said substrate, said active areas having regions that receive and provide stored data bit signals according to word line signals provided thereto, wherein first and second neighboring regions are spaced a substantially different distance from each of said regions; and
    a plurality of storage elements operatively coupled to said regions to store said data bit signals, wherein each of said storage elements is spaced a substantially equal distance from neighboring ones of said storage elements.

16. A semiconductor memory device, according to claim 15, wherein each of said storage elements is a storage electrode having a base portion and at least one other portion extending therefrom.

17. A semiconductor memory device, according to claim 15, wherein said other portion includes multiple cylindrical portions having an outer cylindrical portion and an inner cylindrical portion disposed within said outer cylindrical portion.

18. A semiconductor memory device, according to claim 17, further comprising:

an opposing electrode disposed between said inner and outer cylindrical portions and disposed about an outside surface of said outer cylindrical portion; and a dielectric film between said opposing electrode and said cylindrical portions.

19. A semiconductor memory device, according to claim 18, wherein said opposing electrode is also disposed opposite to an inner surface of said inner electrode and said dielectric film is disposed between said opposing electrode and said inner surface of said inner electrode.

20. A semiconductor memory device, comprising:

a substrate;

active areas means, disposed on said substrate, for coupling to word lines to receive word line signals and for coupling to data bit lines for receiving and providing data bit signals, said active area means having region means for receiving and providing stored data bit signals according to said word line signals, wherein first and second neighboring region means are spaced a substantially different distance from each of said region means; and storage element means for storing said data bit signals, wherein each of said storage element means is spaced a substantially equal distance from neighboring ones of said storage element means.

* * * * *